United States Patent
Wang et al.

(10) Patent No.: US 10,587,271 B2
(45) Date of Patent: *Mar. 10, 2020

(54) CLOCK DISTRIBUTION AND GENERATION ARCHITECTURE FOR LOGIC TILES OF AN INTEGRATED CIRCUIT AND METHOD OF OPERATING SAME

(71) Applicant: Flex Logix Technologies, Inc., Mountain View, CA (US)

(72) Inventors: Cheng C. Wang, San Jose, CA (US); Nitish U. Natu, Santa Clara, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/504,248

(22) Filed: Jul. 6, 2019

(65) Prior Publication Data
US 2019/0334526 A1    Oct. 31, 2019

Related U.S. Application Data

(62) Division of application No. 15/996,430, filed on Jun. 2, 2018, now Pat. No. 10,348,307.

(60) Provisional application No. 62/518,699, filed on Jun. 13, 2017.

(51) Int. Cl.
*H03K 19/177*     (2020.01)
*H03K 19/17736*   (2020.01)
*H03K 19/17796*   (2020.01)
*H03K 19/17728*   (2020.01)

(52) U.S. Cl.
CPC ... *H03K 19/1774* (2013.01); *H03K 19/17728* (2013.01); *H03K 19/17796* (2013.01)

(58) Field of Classification Search
CPC ....... H03K 19/17728; H03K 19/17704; H03K 19/1733; H03K 19/1736; H03K 19/1737; H03K 19/1776; H03K 19/17744; G06F 17/5054
See application file for complete search history.

(56) References Cited

U.S. PATENT DOCUMENTS

| | | | |
|---|---|---|---|
| 5,682,107 | A | 10/1997 | Tavana |
| 5,933,023 | A | 8/1999 | Young |
| 6,028,463 | A | 2/2000 | Albu et al. |
| 6,094,066 | A | 7/2000 | Mavis |
| 6,204,689 | B1 | 3/2001 | Percey et al. |
| 6,211,695 | B1 | 4/2001 | Agrawal |
| 6,429,715 | B1 | 8/2002 | Bapat et al. |

(Continued)

*Primary Examiner* — Seokjin Kim
(74) *Attorney, Agent, or Firm* — Neil A. Steinberg

(57) ABSTRACT

An integrated circuit comprising an array of logic tiles, arranged in an array of rows and columns. The array of logic tiles includes a first logic tile to receive a first external clock signal wherein each logic tile of a first plurality of logic tiles generates the tile clock using (i) the first external clock signal or (ii) a delayed version thereof from one of the plurality of output clock paths of a logic tile in the first plurality, and a second logic tile to receive a second external clock signal wherein each logic tile of a second plurality of logic tiles generates the tile clock using (i) the second external clock signal or (ii) a delayed version thereof from one of the plurality of output clock paths of a logic tile in the second plurality, wherein the first and second external clock signals are the same clock signals.

26 Claims, 29 Drawing Sheets

(56) References Cited

U.S. PATENT DOCUMENTS

| | | |
|---|---|---|
| 6,671,865 B1 | 12/2003 | Ali et al. |
| 6,718,477 B1 | 4/2004 | Plants et al. |
| 6,825,690 B1 | 11/2004 | Kundu |
| 7,145,362 B1 | 12/2006 | Bergendahl et al. |
| 7,430,728 B1 | 9/2008 | Rahut |
| 7,729,415 B1 | 6/2010 | Possley |
| 8,493,090 B1 | 7/2013 | Trimberger |
| 9,240,791 B2 | 1/2016 | Wang |
| 9,496,876 B2 | 11/2016 | Wang |
| 9,882,568 B2 | 1/2018 | Wang |
| 10,348,307 B2 | 7/2019 | Wang et al. |
| 2004/0010767 A1 | 1/2004 | Agrawal et al. |
| 2004/0113655 A1 | 6/2004 | Curd et al. |
| 2005/0050522 A1 | 3/2005 | Kami et al. |
| 2007/0200594 A1 | 8/2007 | Levi et al. |
| 2007/0273403 A1 | 11/2007 | Wang |
| 2008/0061834 A1 | 3/2008 | Tetsukawa et al. |
| 2008/0218202 A1 | 9/2008 | Arriens et al. |
| 2008/0258761 A1 | 10/2008 | Hutchings et al. |
| 2010/0115322 A1* | 5/2010 | Petrick .............. G06F 1/10 713/375 |
| 2011/0012640 A1 | 1/2011 | Vorbach et al. |
| 2011/0121366 A1 | 5/2011 | Or-Bach et al. |
| 2012/0012895 A1 | 1/2012 | Or-Bach et al. |
| 2012/0286822 A1 | 11/2012 | Madurawe |
| 2015/0100756 A9 | 4/2015 | Vorbach et al. |
| 2015/0333756 A1* | 11/2015 | Wang .............. G06F 1/08 326/41 |
| 2016/0246712 A1 | 8/2016 | Vucinic et al. |
| 2016/0321081 A1 | 11/2016 | Kim et al. |
| 2016/0342722 A1 | 11/2016 | Sentieys et al. |

\* cited by examiner

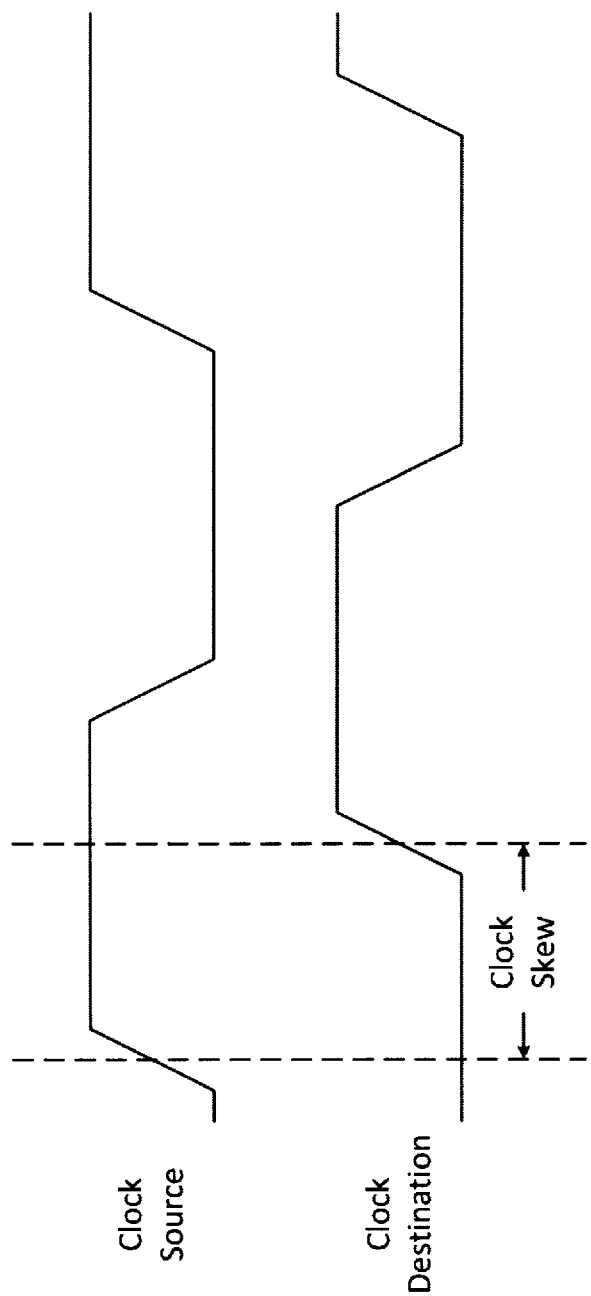

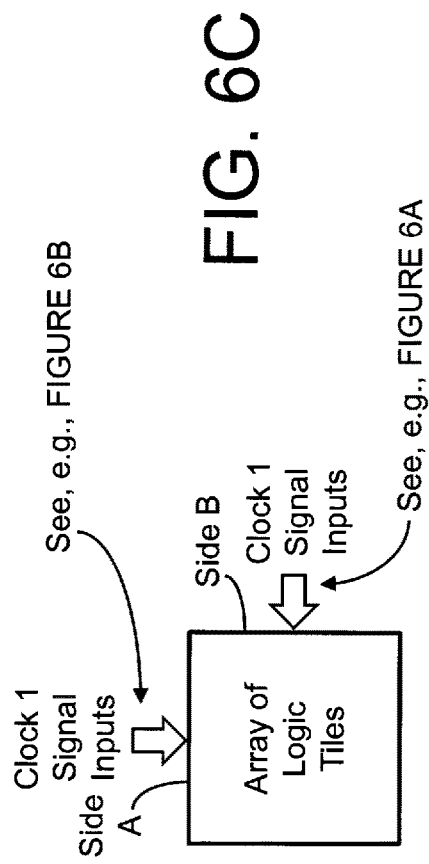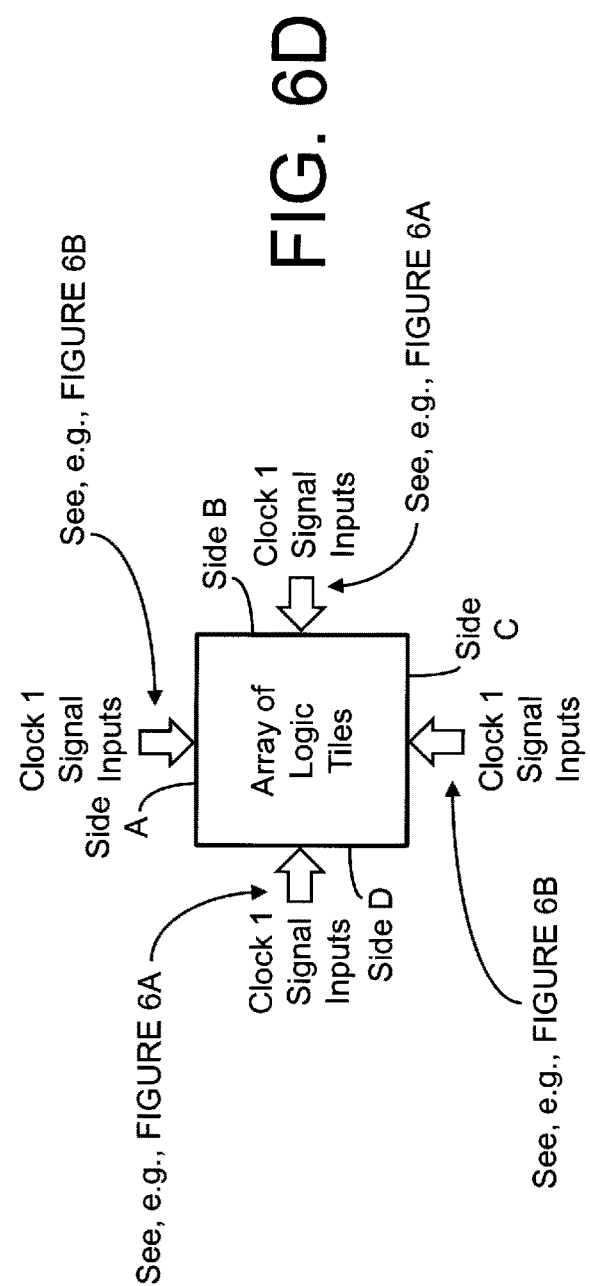

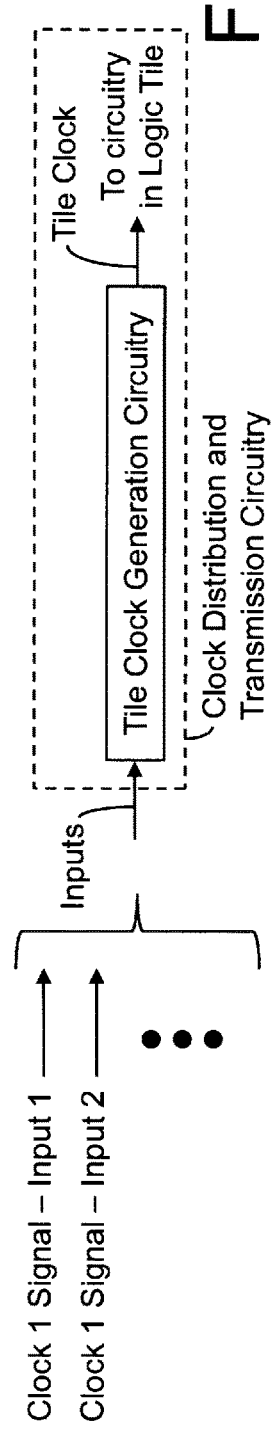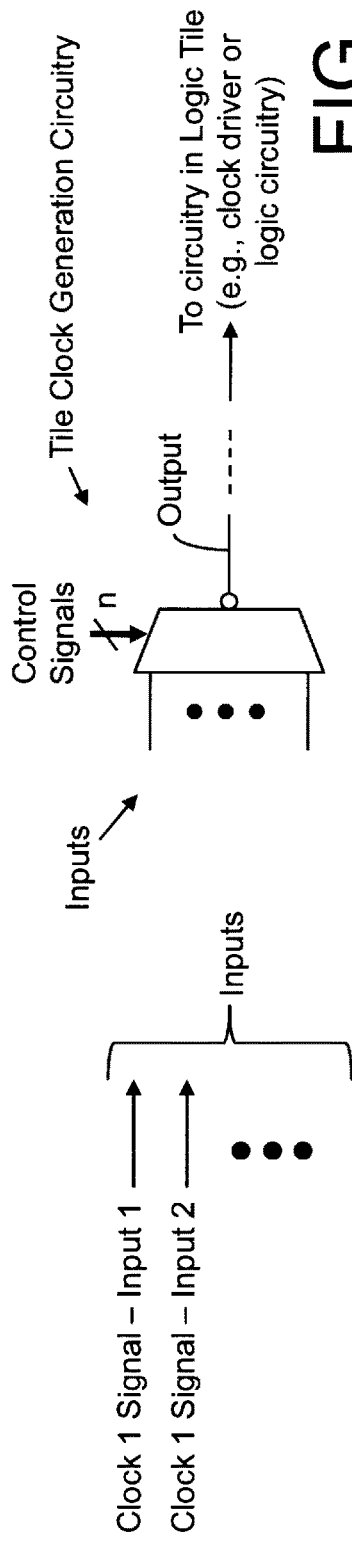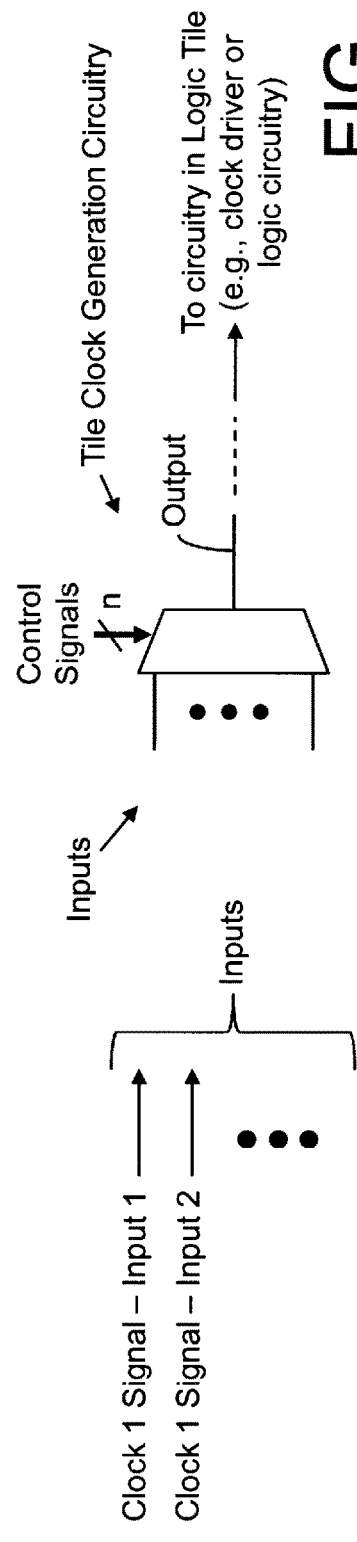
FIG. 7A
FIG. 7B
FIG. 7C

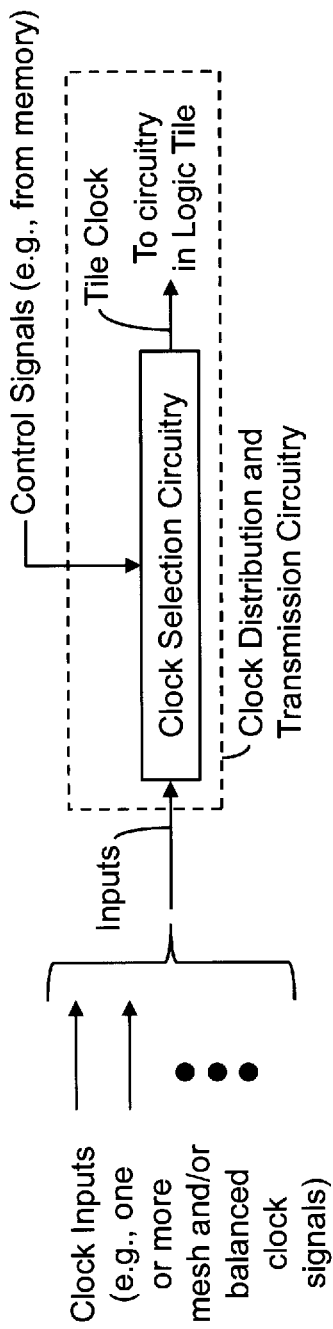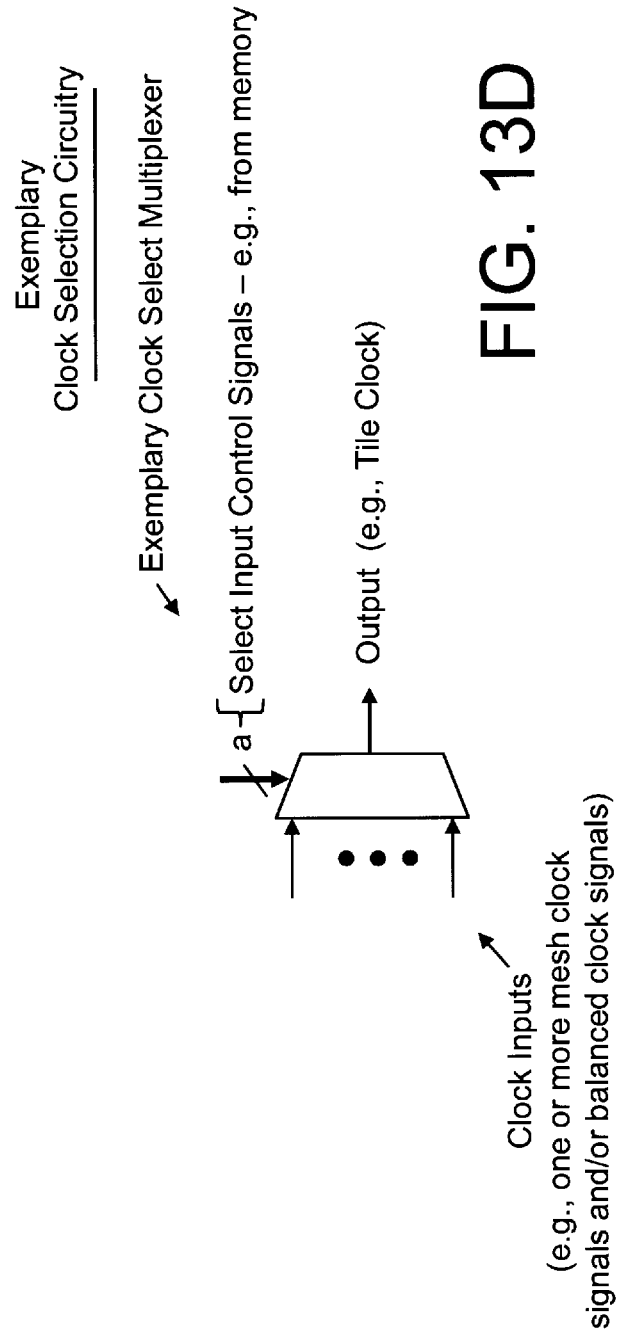

CLOCK DISTRIBUTION AND GENERATION ARCHITECTURE FOR LOGIC TILES OF AN INTEGRATED CIRCUIT AND METHOD OF OPERATING SAME

RELATED APPLICATION

This application is a divisional of U.S. Non-Provisional application Ser. No. 15/996,430, filed Jun. 2, 2018 (U.S. Pat. No. 10,348,307). This application and the '430 application claim priority to and the benefit of U.S. Provisional Application No. 62/518,699, entitled "Clock Distribution and Generation Architecture for Logic Tiles of an Integrated Circuit and Method of Operating Same", filed Jun. 13, 2017. The '699 provisional application is incorporated herein by reference in its entirety.

STATEMENT OF U.S. GOVERNMENT RIGHTS

This invention was made with Government support under Agreement No. HR0011-17-9-0002, awarded by DARPA. The Government has certain rights in the invention.

INTRODUCTION

The present inventions are directed to circuitry of and techniques for clock signal distribution and transmission between logic tiles of an integrated circuit, for example, processors, controllers, state machines, gate arrays, programmable gate arrays (PGAs), field programmable gate arrays (FPGAs), and system-on-chips (SOCs). While the inventions and/or embodiments of the present inventions are often described below in the context of an FPGA, such discussion, inventions and/or embodiments are also applicable to programmable or configurable logic block, logic array block, or logic tile circuitry employed in processors, controllers, state machines, gate arrays, PGAs and SOCs. For the sake of brevity, a separate discussion for each and every integrated circuit is not provided; however the applicability will be clear to one of ordinary skill in the art based on the this disclosure to, for example, processors, controllers, state machines, gate arrays, PGAs, FPGAs, and SOCs.

Briefly, an FPGA is an integrated circuit which may be configured and/or reconfigured (hereinafter, unless stated otherwise, collectively "configured" or the like (e.g., "configure", "configuring" and "configurable")) by, for example, a user, customer and/or a designer before, during and/or after manufacture. In one embodiment, the FPGA includes, among other things, a plurality of tiles having programmable components ("tiles" are often called "configurable logic blocks" (CLB), "logic array blocks" (LAB), or "logic tiles"—hereinafter collectively "logic tiles") and a network of configurable interconnects that facilitate communication between logic tiles as well as internally within logic tiles. Each logic tile has a plurality of inputs and outputs. The programmable interconnect are employed, for example, to connect the inputs and outputs of a logic tile to other logic tiles as well as to the FPGA's external inputs and outputs (which may connect to circuitry outside of the FPGA).

Each logic tile typically includes thousands of transistors which may be configured to perform combinational functions (simple and/or complex). The logic tiles may also include memory elements, for example, flip-flops, registers, blocks/arrays of memory or the like, and/or smaller logic tiles of any kind or type. The logic tiles often include circuitry to synchronize clock signals that, in operation, facilitate orderly implementation of the functions or operations (for example, synchronously) of the logic tile and/or communication with other logic tiles and/or the FPGA's external inputs and outputs.

BRIEF DESCRIPTION OF THE DRAWINGS

The present inventions may be implemented in connection with embodiments illustrated in the attached drawings. These drawings show different aspects of the present inventions and, where appropriate, reference numerals or names illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIG. 1C illustrates waveforms of clock signals reflecting skew (delay) there between when traveling from a clock source to a clock destination; for example, a clock signal may skew when that signal travels from one clock buffer to another clock buffer, or one clock buffer to a logic element such as a flip-flop or a logic tile;

FIGS. 6C and 6D illustrate, in block diagram form, representation of a plurality of interconnected logic tiles (for example, a 7×7 array of logic tiles) of programmable/configurable logic circuitry, according to at least one aspect of the present inventions, wherein, in one embodiment, the array of logic tiles includes a plurality of clock signal inputs at the logic tiles located on the peripheries of two non-opposing sides of the array of logic tiles (see Sides A and B in FIG. 6C), and, in another embodiment, the plurality of clock signal inputs are located at the logic tiles located on the peripheries of all of the sides of the array of logic tiles (see Sides A-D in FIG. 6D); notably, in one embodiment, the clock signal inputs at/on Sides A and/or C correspond to the embodiment of FIG. 6B, and the clock signal inputs at/on Sides B and/or D correspond to the embodiment of FIG. 6A;

FIG. 7A illustrates, in block diagram form, an exemplary embodiment of at least a portion of the tile clock generation circuitry of the clock distribution and transmission circuitry of a logic tile, according to at least one aspect of the present inventions, wherein, in operation, the tile clock generation circuitry receives a plurality of clock signals at the inputs which are delay matched to include appropriate and/or programmable skew relative to the tile clock signals of other logic tiles (e.g., substantially no or zero skew), each clock signal is associated with a clock signal applied to a clock signal input to the array of logic tiles, and employs such clock signals to generate a tile clock for the associated logic tile;

FIGS. 7B and 7C illustrate exemplary embodiments of at least a portion of the tile clock generation circuitry of the clock distribution and transmission circuitry of a logic tile wherein in these exemplary embodiments an N-input inverting multiplexer and an N-input non-inverting multiplexer (where N≥2), respectively, according to at least one aspect of the present inventions, wherein, in operation, such multiplexers receive a plurality of clock signals at the inputs, each clock signal is associated with a clock signal applied to a clock signal input to the array of logic tiles, wherein the control signals applied to the multiplexers, in operation, in one embodiment, select one input to transmit to the output of the multiplexer, or in another embodiment, select two or more of the inputs such that at least two of the clock signals applied to the inputs of the multiplexer are, in operation, shorted at the output of the multiplexer, effectively creating a clock-mesh structure distributed over the array of logic tiles; notably, for the avoidance of doubt, the present inventions may employ multiplexers like those illustrated in FIGS. 4A and 4B of U.S. Pat. No. 9,786,361 wherein the multiplexers may be programmed so that a plurality of input-selections are enabled wherein a plurality of inputs are electrically connected to the multiplexer output via the input-output path(s) in or of the multiplexer;

FIGS. 13C and 13D illustrates, in block diagram and schematic forms, exemplary embodiments of clock selection circuitry according to at least one aspect of the present inventions; in particular, FIG. 13C illustrates, in block diagram form, an exemplary embodiment of clock selection circuitry of the clock distribution and transmission circuitry of a logic tile, according to at least one aspect of the present inventions, wherein, in operation, the clock selection circuitry receives a plurality of clock signals at the inputs (for example, one or more mesh clock signals and one or more delay matched clock signals that include appropriate or programmable skew relative to the tile clock signals of other logic tiles (e.g., substantially no or zero skew)), and FIG. 13D illustrates, in schematic form, clock selection circuitry implementing a clock select multiplexer to select one or more inputs to connect to the output.

Figure 1A:
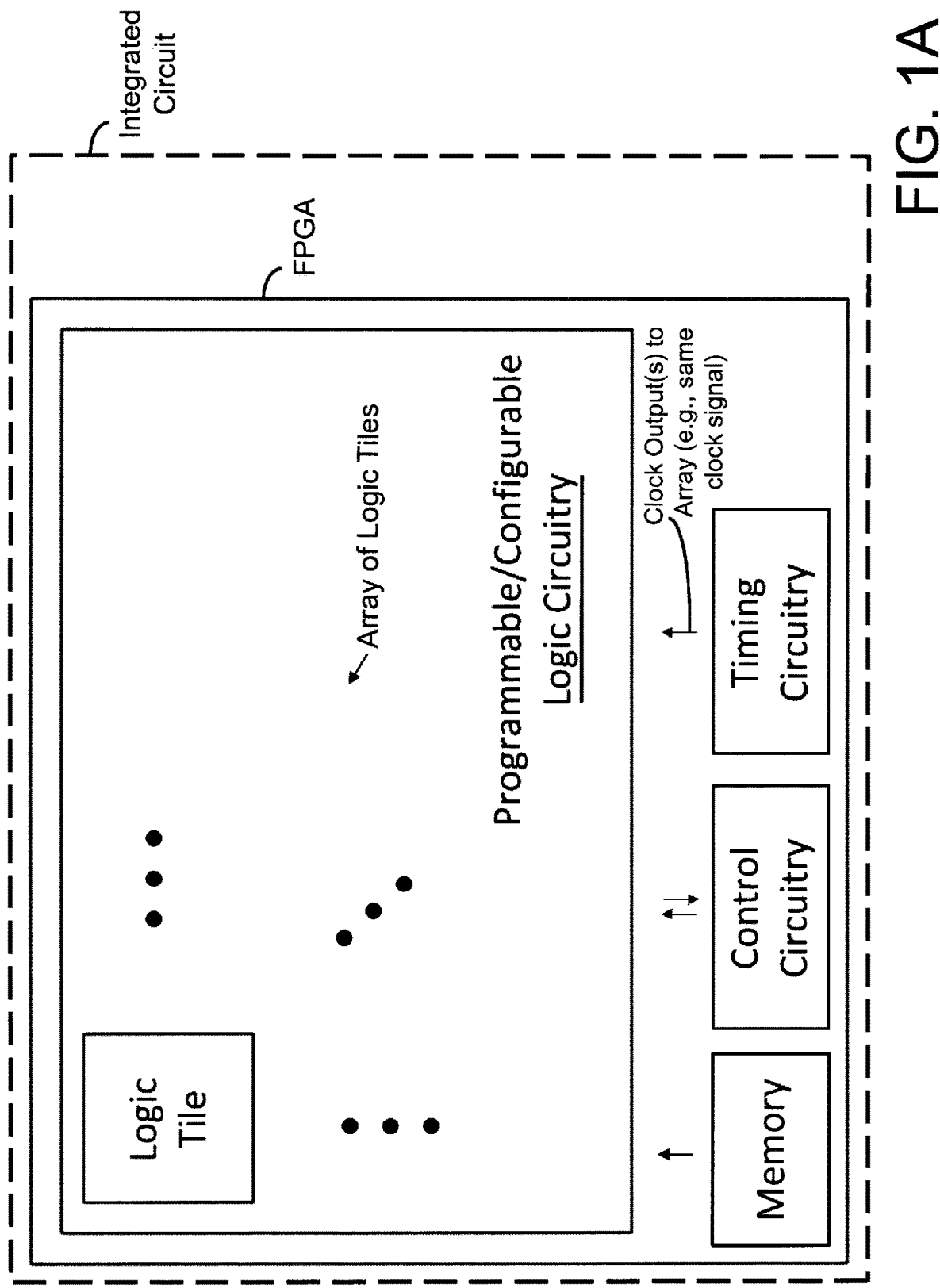
FIG. 1A illustrates a block diagram representation of, for example, an integrated circuit including control circuitry, clock or timing circuitry and programmable/configurable logic circuitry (which may include one or more logic tiles (each of which includes (i) logic transistors and (ii) clock distribution and transmission circuitry); in the illustrative embodiment, the clock/timing circuitry is disposed "on-chip", for example, clock/timing circuitry fabricated or integrated in/on the die of the integrated circuit generates one or more of the clock signals (the same clock signal or a derivative thereof) and outputs the clock signal(s) to the programmable/configurable logic circuitry (and the physical array of logic tiles thereof); each clock signal is input into a plurality (or all) of logic tiles (for example, logic tiles located on the periphery of the programmable/configurable logic circuitry) and, in one embodiment, is employed by the logic tiles of the programmable/configurable logic circuitry to generate tile clocks having a desired or programmable skew (for example, substantially no or zero skew) and/or phase (for example, 0 degrees or 180 degrees) relative to the tile clocks of other logic tiles of the programmable/configurable logic circuitry; notably, the clock circuitry may be partially or entirely off-chip (i.e., external to the die of the integrated circuit)

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

In one aspect, the present inventions relate to circuitry for and methods of using, providing, distributing, generating and/or transmitting clock signals in and/or between an array of logic tiles in integrated circuits, for example, processors, controllers, state machines, gate arrays, PGAs, FPGAs, and SOCs. The architectures, circuitry and techniques of the present inventions, in one embodiment, distribute and/or transmit a plurality of input clock signals in and/or between an array of logic tiles of an integrated circuit to generate tile clocks within each of the logic tiles wherein the tile clock of each logic tile includes a desired or programmable skew relative to the tile clocks of other logic tiles of the programmable/configurable logic circuitry of the integrated circuit. For example, in one embodiment, two or more logic tiles of an array of logic tiles receive the same (or a derivative) clock signal, and distribute and/or transmit the clock signal to neighboring logic tiles wherein circuitry in the clock distribution and transmission circuitry of each logic tile facilitate or implement delay matching of the clock signal transmitted or distributed from logic tile to logic tile, such that each logic tile generates local clock signals (i.e., tile clocks) that are balanced and/or synchronous and have substantially no or zero skew and/or phase difference relative to the clock signals generated and employed in or by other logic tiles of the array of logic tiles of the integrated circuit.

In one embodiment, such two or more logic tiles are located on two or more (or all) of the perimeters of an array of logic tiles of the array of logic tiles. That is, in one embodiment, the two or more logic tiles are disposed on or form opposing perimeters of the array (for example, logic tiles located at diagonal corners of the opposing perimeters) and include clock inputs to receive the same clock signal. Thereafter, circuitry of the logic tiles distribute and/or transmit the clock signals to neighboring logic tiles of/in an associated row and/or column of the array of logic tiles. The circuitry in the clock distribution and transmission circuitry of each logic tile implement delay matching of the clock signal transmitted or distributed from logic tile to logic tile, such that each logic tile of the array receives, generates and/or employs a clock signal having a predetermined skew relative to the clock signals of other logic tiles (for example, synchronous and substantially no or zero skew and/or phase difference relative to the clock signals generated and employed in or by other logic tiles of the array of logic tiles of the integrated circuit). Such clock signals are employed by circuitry in the logic tile to generate local clock signals (i.e., tile clocks) that are balanced with respect to other clock signals of other logic tiles of the array. The local clock signals (i.e., tile clocks) may be employed by circuitry in the logic tile to facilitate implementation of functions or operations of the logic tile and/or communication with other logic tiles and external inputs and outputs.

In yet another embodiment, logic tiles located on or forming two non-opposing perimeters of the array of logic tiles (for example, all logic tiles disposed on or forming two non-opposing perimeters of the array of logic tiles) include clock inputs to receive clock signals. Here, such clock inputs may receive the same (or a derivative) clock signal. The clocks signals are thereafter provided, distributed and/or transmitted to neighboring logic tiles in the associated rows and columns of the array of logic tiles. In this embodiment, the clock distribution and transmission circuitry of each logic tile receive two clock signals—one clock signal from a neighboring logic tile of an associated row and one clock signal from a neighboring logic tile of an associated column. In one embodiment, circuitry in the clock distribution and transmission circuitry, in addition to implementing delay matching of the clock signal transmitted or distributed from logic tile to logic tile, generate a local clock signal using the two clocks signals. That is, on a tile-by-tile basis, the clock signal transmitted or distributed to/from logic tile in the row direction, after delay matching, and the clock signal transmitted or distributed to/from logic tile in the column direction, after delay matching, are employed to generate local clock signals (i.e., tile clocks) that are balanced with respect to tile clocks of the other logic tiles. The tile clocks are used by circuitry in the logic tile to facilitate implementation of functions or operations of the logic tile and/or communication with other logic tiles and external inputs and outputs. For example, in one embodiment, the two delay matched clock signals are "shorted" to generate one or more local clock signals (for example, tile clocks of the associated logic tile). In one embodiment, the two delay matched clock signals are "shorted" via a multiplexer wherein the inputs are independently controlled thereby allowing more than one input to be concurrently connected to the output through the multiplexer input-to-output path.

Indeed, in another embodiment, all of the logic tiles of or forming the perimeters of an array of logic tiles (for example, all four perimeters of the array of logic tiles) include clock signal inputs to receive the same clock signal (and/or a derivative clock signal). In this embodiment, the clocks signals are distributed and/or transmitted to neighboring logic tiles from opposing sides of the array of logic tiles for both the row and column direction of the array. Here, the circuitry of the clock distribution and transmission circuitry of each logic tile may employ one, two, three or four of the delay matched clock signals received by the clock distribution and transmission circuitry of the logic tile in the generation of the local clock signal(s). For example, such circuitry may generate a local clock signal using the clocks signals that are distributed and/or transmitted (i) from both opposing sides to/from logic tiles in the same row and (ii) from both sides to/from logic tiles in the same column (i.e., four delay matched clock signals). Like that described above, on a tile-by-tile basis, the two clock signals transmitted or distributed to/from logic tile in the row direction (one clock signal transmitted or distributed from each side of the array along the associated row), after delay matching, one or both are employed to generate one or more local clock signals which is/are employed (or a derivative thereof is employed) by circuitry in the logic tile. Similarly, the two clock signal transmitted or distributed to/from logic tile in the column direction (one clock signal transmitted or distributed from each side of the array along the associated column), after delay matching, one or both are employed to generate one or more local clock signals which is/are employed (or a derivative thereof is employed) by circuitry in the logic tile. For example, in one embodiment, the delay matched clock signals are "shorted" to generate one or more local clock signals (for example, tile clocks of the associated logic tile, effectively creating a clock-mesh structure for the delay-matched clock signals between the array of tiles). In one embodiment, all are shorted together using the same circuitry; in another embodiment, the delay matched clock signals from the row direction and the column direction are each first shorted and thereafter, the shorted signals from the row direction and the shorted signals form the column direction are then shorted to generate one or more local clock signals. It should be noted that all circuitry and techniques for shorting the clock signals are intended to fall within the scope of the present inventions including, for example, a multiplexer wherein the inputs are independently controlled thereby allowing more than one input to be concurrently connected to the output through the multiplexer input-to-output path.

Figure 1B:
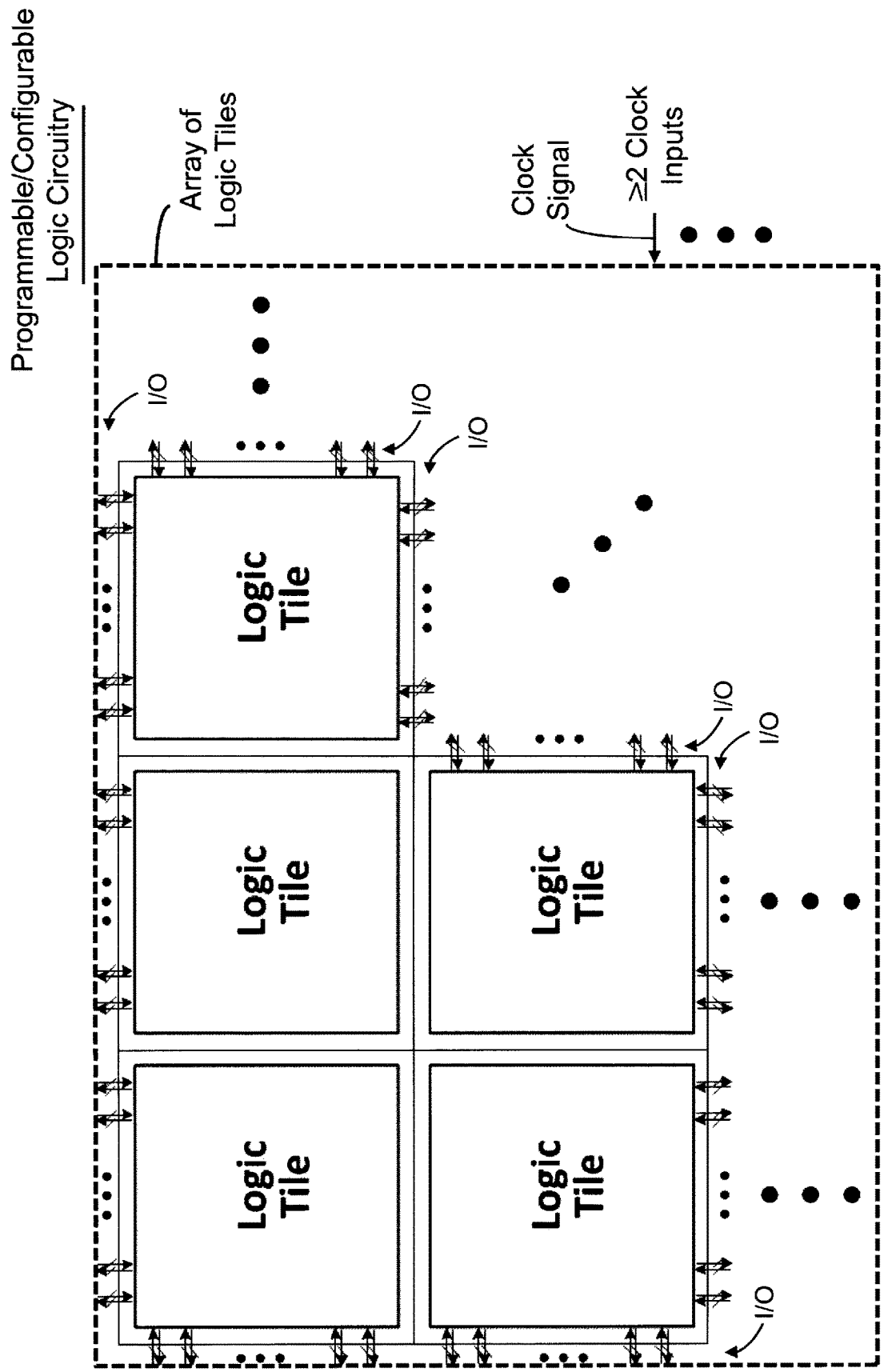
FIG. 1B illustrates a block diagram representation of a plurality of interconnected logic tiles of programmable/configurable logic circuitry, for example, an FPGA, wherein input/output of the logic tiles may facilitate communication between logic tiles and/or circuitry external to the programmable/configurable logic circuitry; notably, the programmable/configurable logic circuitry includes an array of logic tiles interconnected via a one or more configurable interconnects, wherein the array of logic tiles includes a plurality of clock signal inputs to receive a clock signal output by clock circuitry (see FIG. 1A); moreover, the logic tiles (for example, all logic tiles) include clock distribution and transmission circuitry to (i) generate a tile clock (i.e., a clock employed by logic circuitry in the tile) using the tile's clock tree (see, for example, "Tile Clock" in FIGS. 2A-2C) and (ii) distribute or transmit the tile clock or a related clock signal to one or more neighboring logic tiles; the tile clock signal, in one embodiment, is employed to generate a tile clock (see, for example, FIGS. 2A-2C, 13A and 13B) for use by logic circuitry (and/or memory) of the associated logic tile to perform, for example, operation therein.

With reference to FIGS. 1A and 1B, in one embodiment, the integrated circuit includes control circuitry, clock circuitry and programmable/configurable logic circuitry which may include one or more logic tiles. Each of the logic tiles may include logic and/or memory transistors (not illustrated) and clock distribution and transmission circuitry which is configurable to, among other things, generate tile clock signal(s) having a desired or programmable skew (for example, substantially no or zero skew) and/or phase (for example, 0 degrees or 180 degrees) relative to the tile clock signal(s) of other logic tiles of the programmable/configurable logic circuitry. For example, circuitry in the clock distribution and transmission circuitry of each logic tile implement delay matching of the clock signal transmitted or distributed from logic tile to logic tile, such that each logic tile of the array generates local clock signals (i.e., tile clocks) that are synchronous and have substantially no or zero skew and/or phase difference relative to the clock signals generated and employed in or by other logic tiles of the array of logic tiles. Such local clock signals (i.e., tile clocks) (and/or a derivative thereof) may be employed by circuitry in the logic tile to facilitate implementation of functions or operations of the logic tile and/or communication with other logic tiles and external inputs and outputs.

Briefly, "clock skew" refers to the delays incurred by the clock signals as it travels from a clock source to a clock destination (see, FIG. 1C). This may occur, for example, when traveling from one clock buffer to another clock buffer, or one clock buffer to a logic or memory element such as a flip-flop, a CLB, and/or a logic tile. In this application, clock skew refers to the delay in the clock signals when the clock signals travel from one logic tile to another logic tile.

With reference to FIGS. 1A, 1B and 2A-2C, the clock distribution and transmission circuitry of the logic tiles, in one embodiment, generates a tile clock (see, for example, FIG. 2A) for the logic circuitry (and/or memory) of the associated logic tile and, in addition, distributes or transmits the tile clock signal or a related clock signal to one or more neighboring or juxtaposed logic tiles of the programmable/configurable logic circuitry via one or more of the clock paths. The clock distribution and transmission circuitry of a logic tile, in one embodiment, includes a plurality of output paths (four paths in this illustrated embodiment—labeled "north clock path", "east clock path", "south clock path" and "west clock path") to generate tile clock signals having a desired or programmable skew and, in certain situations, to distribute or transmit one or more tile clock signals or related clock signals to one or more neighboring logic tiles of the array of logic tiles. Notably, in the exemplary embodiment of FIG. 2A, each of the four clock path has one tile output clock path, one tile input clock path, and one tile u-turn circuit; whereas in the exemplary embodiment of FIGS. 2B and 2C, each of the four clock path has two or more tile output clock paths, two or more tile input clock paths, and two or more tile u-turn circuits.

Figure 2A:
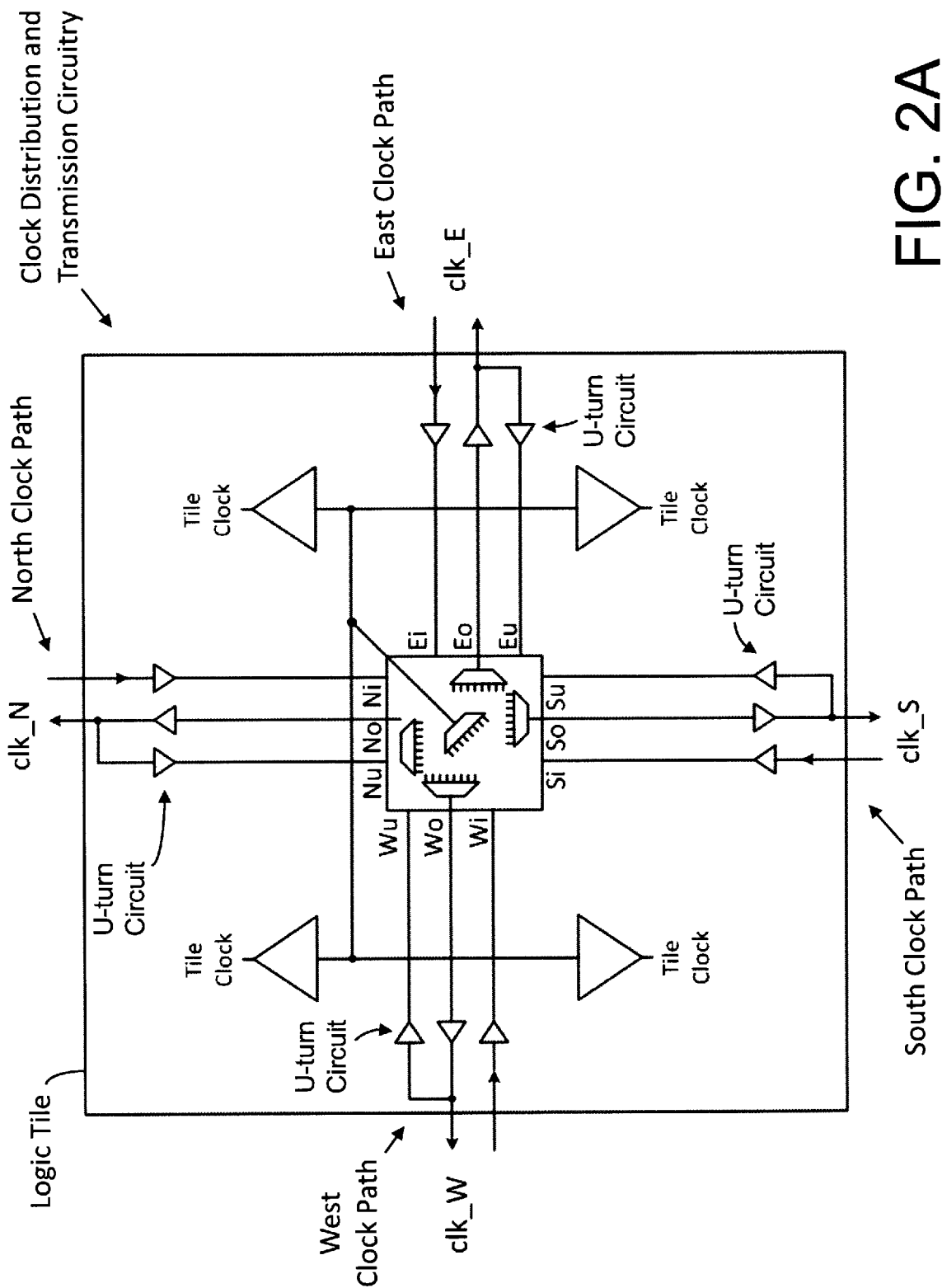
FIGS. 2A-2C illustrate, in a schematic block diagram form, exemplary embodiments of clock distribution and transmission circuitry of a logic tile wherein in these exemplary embodiments, the clock distribution and transmission circuitry includes a plurality of input and output paths (four paths in this illustrated embodiment—labeled "north clock path", "east clock path", "south clock path" and "west clock path") to generate tile clock signals having a desired or programmable skew and, in certain embodiments, to distribute or transmit one or more tile clocks or related clock signals to one or more neighboring logic tiles of the programmable/configurable logic circuitry; each of the input and output paths may include one input/output and u-turn circuit (FIG. 2A), or more than one input/output and u-turn circuit (FIGS. 2B and 2C), or combinations thereof; notably, in this exemplary embodiment, the u-turn circuit includes one or more buffers with their associated wire/conductor routing which, in whole or in part, may be employed in the clock signal distribution path to generate a tile clock signal (having the desired, appropriate or programmable skew relative to the tile clock signals of other logic tiles—see, for example, FIG. 3A) that, in one embodiment, is employed to generate the Tile Clock (i.e., a local clock for that logic tile); as noted above, the Tile Clock may be employed by, for example, logic circuitry (and/or memory) to implement functions or operations of the associated logic tile and/or synchronize communication with other logic tiles and/or the external inputs and outputs of the programmable/configurable logic circuitry.
Figure 2B:
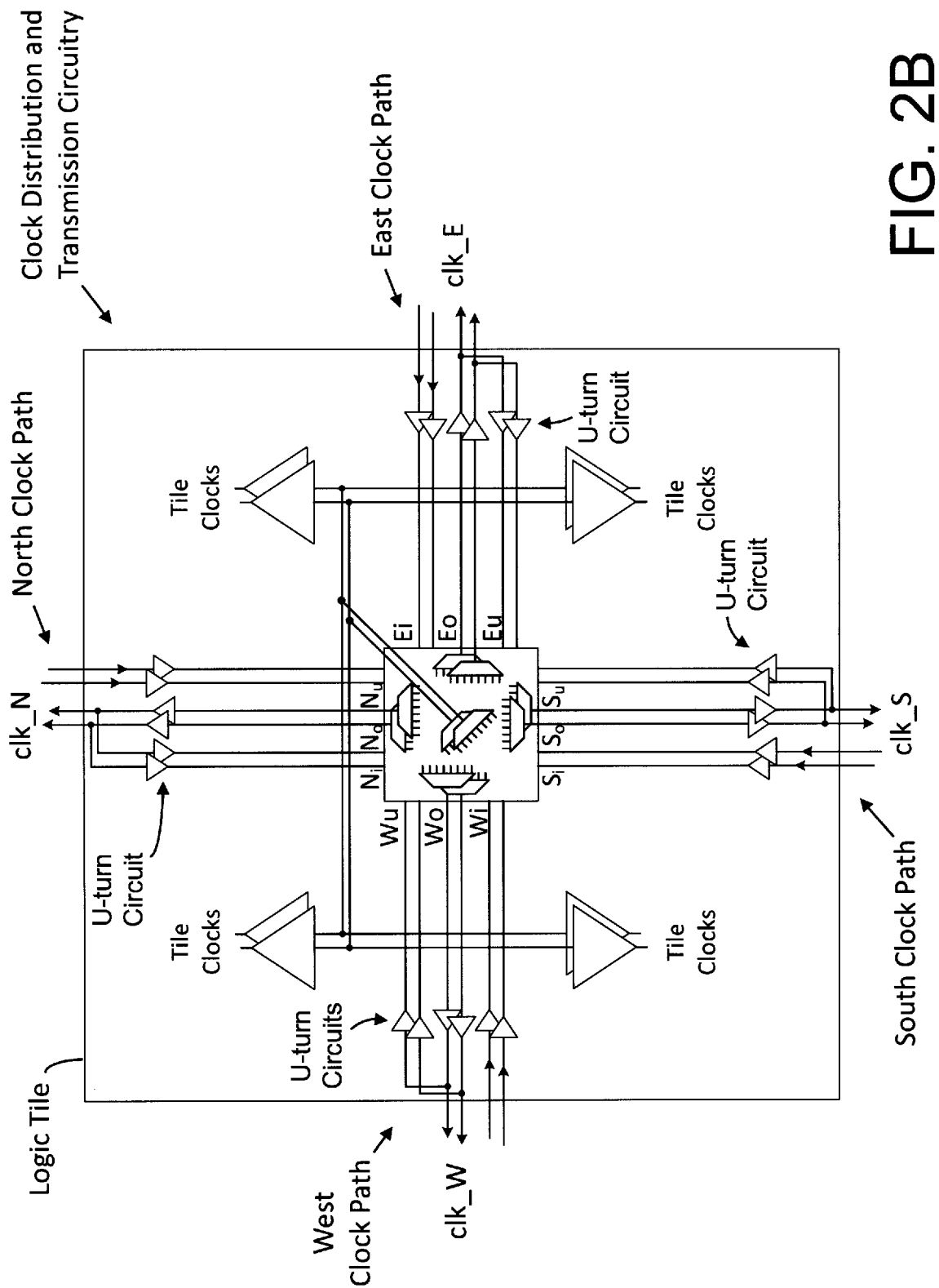
Figure 2C:
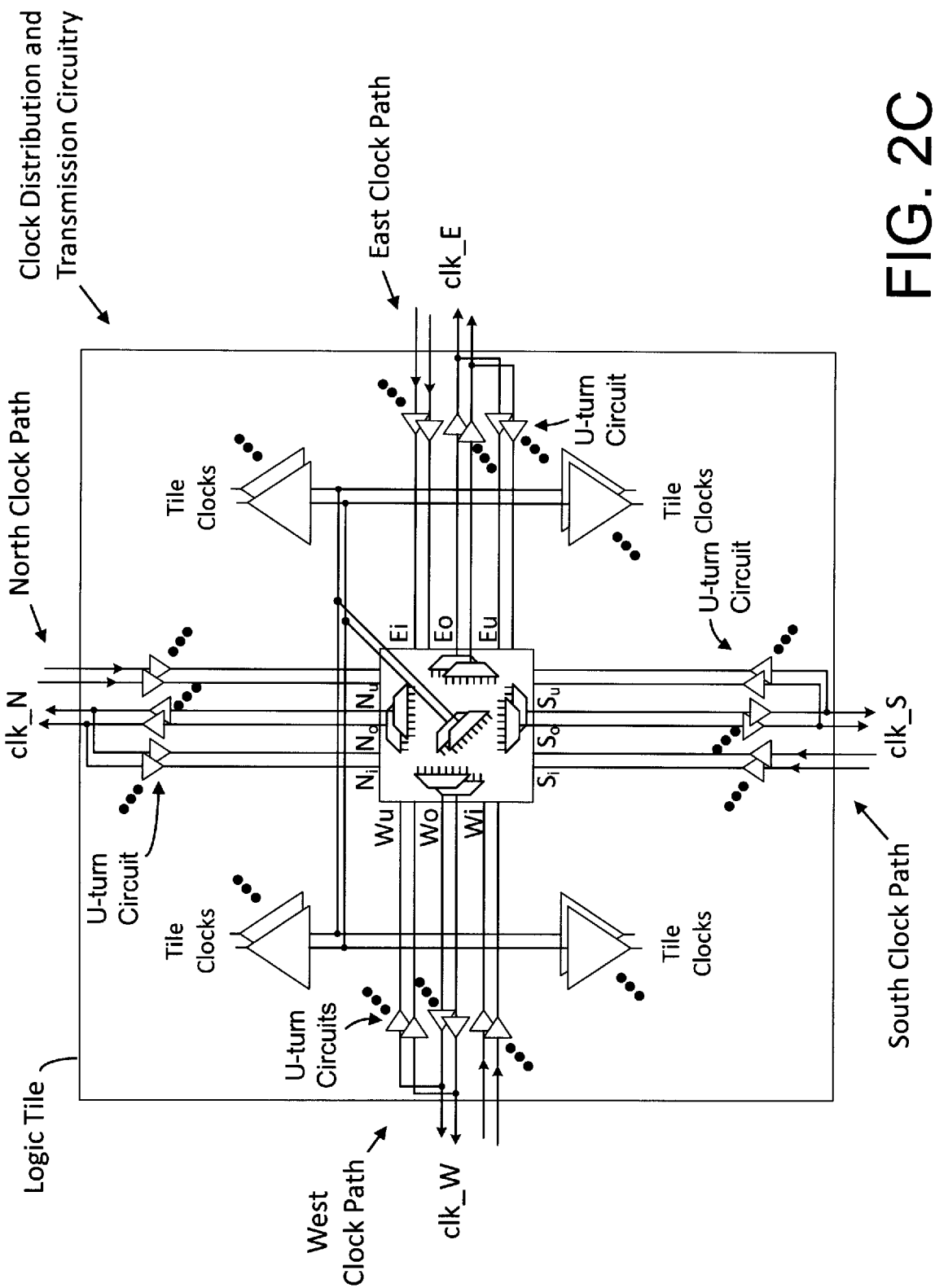

In one embodiment, each clock path includes a plurality of transistors (configured and illustrated, in the exemplary embodiment of FIGS. 2A-2C, as a plurality of buffers). Here, the exemplary clock distribution and transmission circuitry includes one or more u-turn circuits which may be selectively incorporated into the clock signal distribution path of the logic tile to generate a tile clock signal having the desired or programmable skew (for example, substantially no or zero skew) and/or phase (for example, 0 degrees or 180 degrees) relative to the tile clock signals of other logic tiles of the programmable/configurable logic circuitry of an integrated circuit. In this exemplary embodiment, a u-turn circuit is disposed at each of the output paths to provide flexibility in design and layout of the architecture for clock generation of one, some or all of the logic tiles of the programmable/configurable logic circuitry. The u-turn circuits in the logic tile may consist of the same or different type circuits or elements—for example, the u-turn circuit of a first output path may consist of one buffer and the u-turn circuit of a second output path may consist of two or more buffers. However, it may be advantageous to construct the u-turn circuits with the same type of circuits (for example, buffers and associated conductors) and/or the same or similar electrical characteristics as the input and output paths. In this way, it may facilitate delay matching of the clock signals from logic tile to logic tile. For example, it may be advantageous to design paths having the same resistive and capacitive loading, the same wire length and shielding, the same type of clock buffers, and the same transistors of such clock buffers to more fully match the delay of the clock signals from logic tile to logic tile. Notably, although in the illustrative embodiments a u-turn circuit is located at all of the output paths of a logic tile, one or more logic tiles may include output paths that do not include u-turn circuits at one, some or all of the output paths.

As mentioned above, the layout of the clock distribution and transmission of the one, some or all of the logic tiles of the programmable/configurable logic circuitry may provide a desired or programmable skew of the clock signals associated with the logic tiles of the programmable/configurable logic circuitry of an integrated circuit. In one embodiment, the clock distribution and transmission circuitry in each logic tile generates local clock signals that are synchronous and have substantially no or zero skew relative to the tile clock signals employed in or by other logic tiles of the programmable/configurable logic circuitry.

With reference to FIGS. 3A-3G, the array of logic tiles receives a plurality of clock signals having the same or substantially characteristics (for example, frequency and phase) at the clock signal inputs. For example, with reference to FIGS. 3A-3C, in one embodiment, the array of logic tiles includes two clock inputs to receive Clock 1 Signal. In one embodiment, the two clock signals are provided to logic tiles located at or of diagonal corners of the opposing sides of the perimeters of the array of logic tiles (see, for example, Logic Tile 1 and Logic Tile 25 of the 5×5 array of logic tiles of FIG. 3A). In another embodiment, clock signals are provided to each of the logic tiles of opposing sides of the perimeters of the array of logic tiles (see, for example, FIGS. 3D and 3E). In yet another embodiment clock signals are provided to each logic tile of the perimeter of the array (see, for example, FIG. 3G). In one embodiment, each of the Clock 1 Signals is routed or transmitted to/from neighboring logic tiles of the array of logic tiles such that each Logic Tile receives Clock 1 Signal. The clock distribution and transmission circuitry of the logic tiles, in addition to routing or transmitting such clock signal to the neighboring logic tiles incorporates, provides or implements suitable delay matching (via, for example, the u-turn circuits) to provide, generate and/or employ a clock signal having substantially no or zero skew and/or phase difference relative to the clock signals provided, generated and/or employed in or by other logic tiles of the array of logic tiles of the integrated circuit.

For example, with reference to FIGS. 4A, 4B, 5A and 5B, in one embodiment, the clock distribution and transmission path for Logic Tiles 1-5 provides substantially no or zero skew between the Tiles 1-5 Clock Signals and/or the Tile Clocks of the Logic Tiles 1-5. The clock signal distribution path, and direction thereof, is indicated by the bold line and the arrows. The clock distribution and transmission circuitry of each Logic Tile 1-5 is programmed to provide a Tile Clock Signal and/or Tile Clock that has substantially no or zero skew relative to the other Tile Clock Signals and/or Tile Clock, respectively.

Figure 4A:
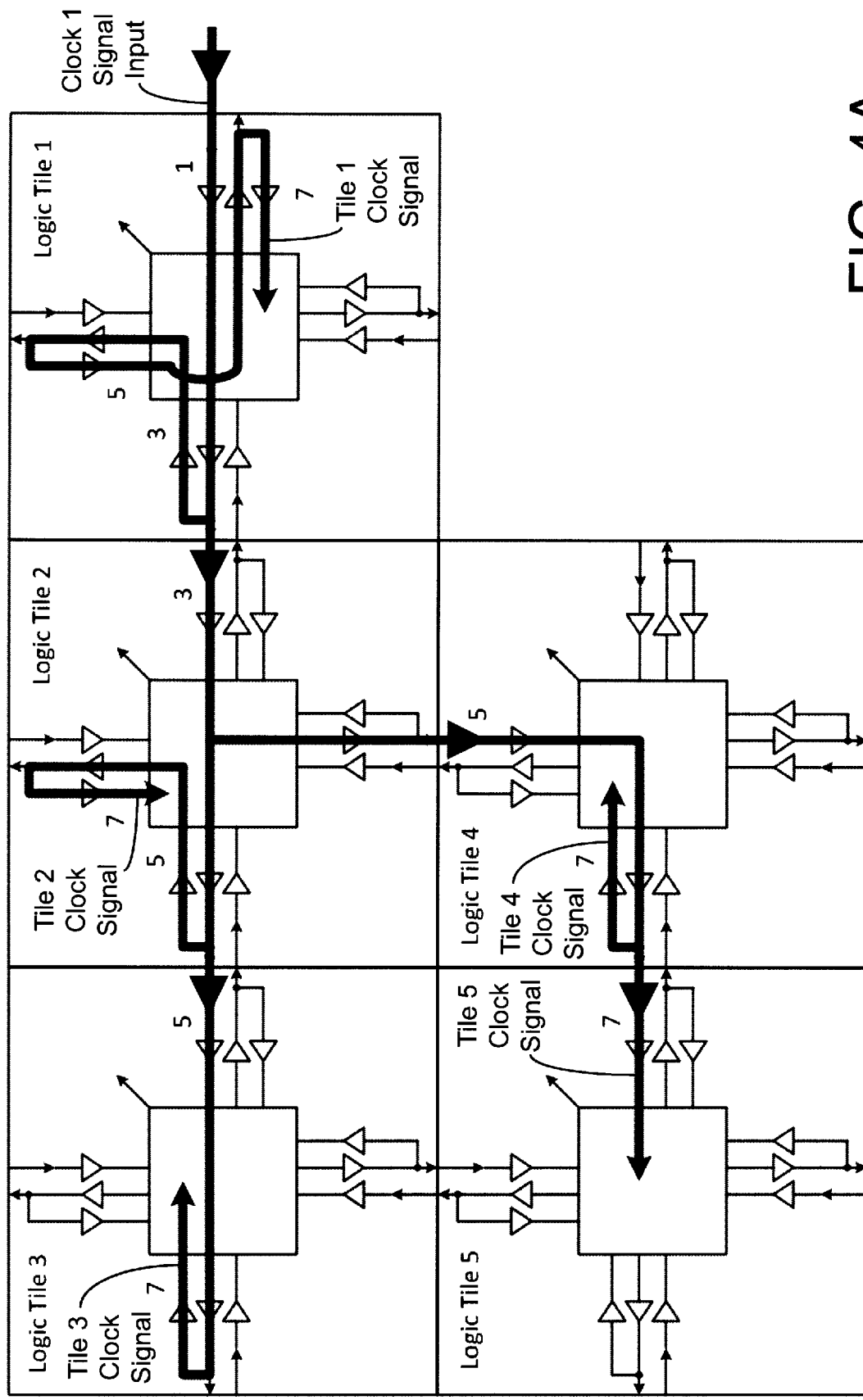
FIGS. 4A and 4B illustrate exemplary block diagram representations of a plurality of interconnected logic tiles of, for example, the type of logic tiles illustrated in FIG. 2A, wherein the tile clock signals are generated in each of the logic tiles via the exemplary clock distribution and transmission circuitry of the associated logic tile; the exemplary clock distribution and distribution paths, and directions thereof, are indicated by the bold line (solid line in FIG. 4A and dashed line in FIG. 4B) and the arrows wherein the clock distribution and transmission circuitry of each logic tile is configured or programmed to provide a clock distribution and distribution path that provides the programmed relationship of the tile clock signals (for example, substantially no or zero skew) that are employed by each of the logic tiles; in the exemplary embodiment of FIG. 4A, Clock 1 signal input is received by Logic Tile 1 which, in addition to distributing and transmitting the clock signal to Logic Tile 2, incorporates a delay that provides a predetermined relationship of the clock signal employed by Logic Tile 1 to the clock signals of Logic Tiles 2-5 (and, in certain embodiments, one, some or all of the other Logic Tiles of the programmable/configurable logic circuitry); in the exemplary embodiment of FIG. 4B, Clock 2 signal input is received by Logic Tile 2 which, in addition to distributing and transmitting the clock signal to Logic Tiles 1, 3 and 4, incorporates a delay that provides a predetermined relationship of the clock signal employed by Logic Tile 2 to the clock signals of Logic Tiles 1 and 3-5 (and, in certain embodiments, one, some or all of the other Logic Tiles of the programmable/configurable logic circuitry); notably, one or more of the clock signal inputs may originate directly or indirectly from clock circuitry disposed "on-chip", for example, clock circuitry integrated in/on the die of the integrated circuit (see, for example, FIG. 1A) or clock circuitry which is partially or entirely external to the die of the integrated circuit (for example, Clock 1 and/or Clock 2 may originate on another logic tiles and/or clock alignment circuitry (for example, a DLL or PLL) which is partially or fully on-chip or off-chip.

In particular, with reference to the exemplary embodiment of FIG. 4A, the clock signal input ("Clock 1 Signal") is applied to and received by Logic Tile 1. The total delay introduced by each Logic Tile is 7 "units". The clock signal distribution path for: (i) Tile 1 Clock Signal, which is associated with Logic Tile 1, incorporates three u-turn circuits (thereby providing a total delay of 7 units), (ii) Tile 2 Clock Signal, which is associated with Logic Tile 2, incorporates two u-turn circuits (thereby providing a total delay of 7 units), (iii) Tile 3 Clock Signal, which is associated with Logic Tile 3, incorporates one u-turn circuit (thereby providing a total delay of 7 units), (iv) Tile 4 Clock Signal, which is associated with Logic Tile 4, incorporates one u-turn circuit (thereby providing a total delay of 7 units) and (v) Tile 5 Clock Signal, which is associated with Logic Tile 5, does not incorporate a u-turn circuit (thereby providing a total delay of 7 units). In this way, the Tile Clock Signals of the Logic Tiles 1-5 of FIG. 4A have substantially no skew there between (in this exemplary embodiment, each include 7 units of delay in the clock distribution path, where each unit represents the equivalent delay of 1 clock branch, which in this exemplary embodiment is the delay of one clock buffer plus its associated wire routing).

Figure 4B:
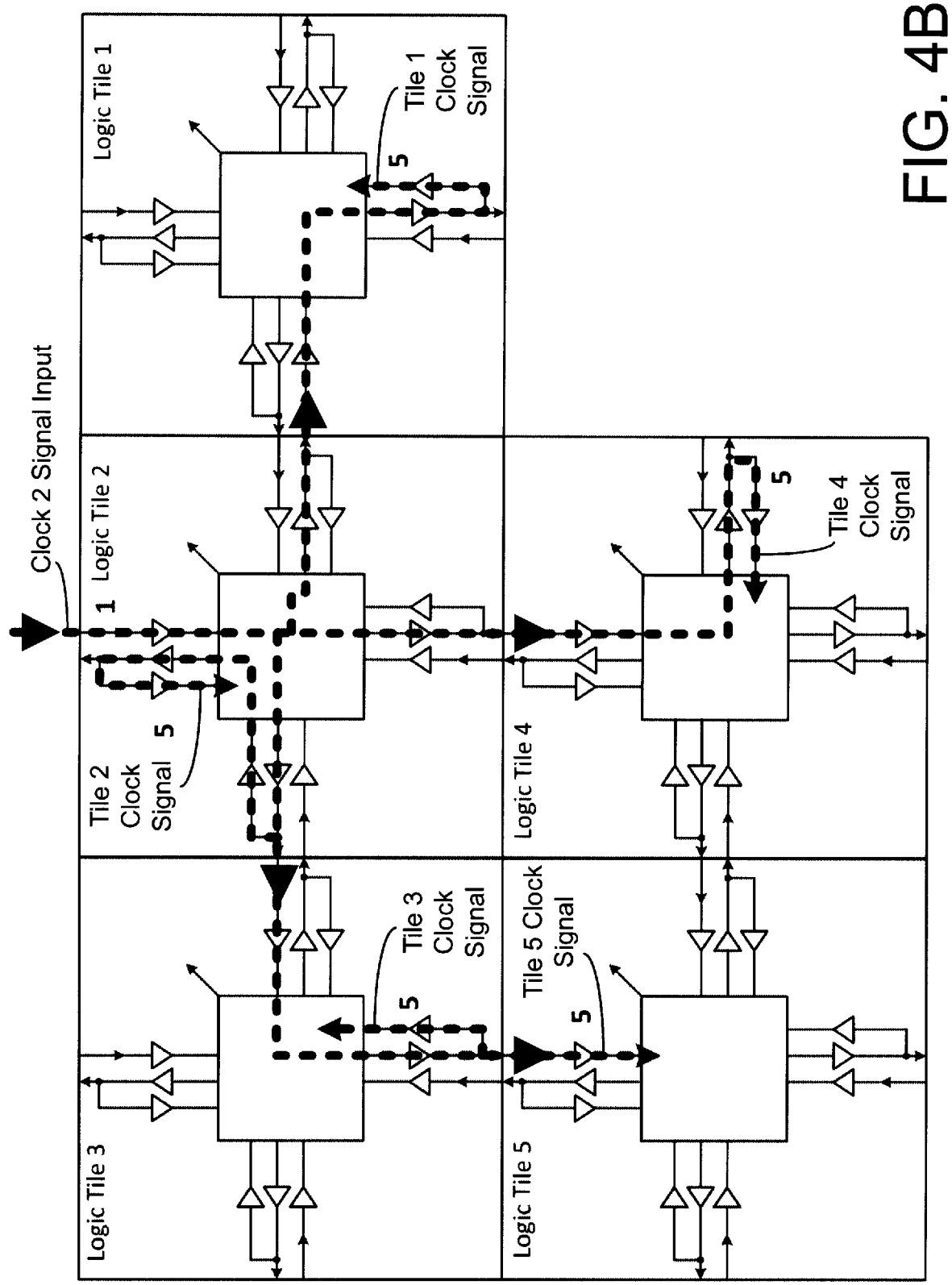
Figure 5A:
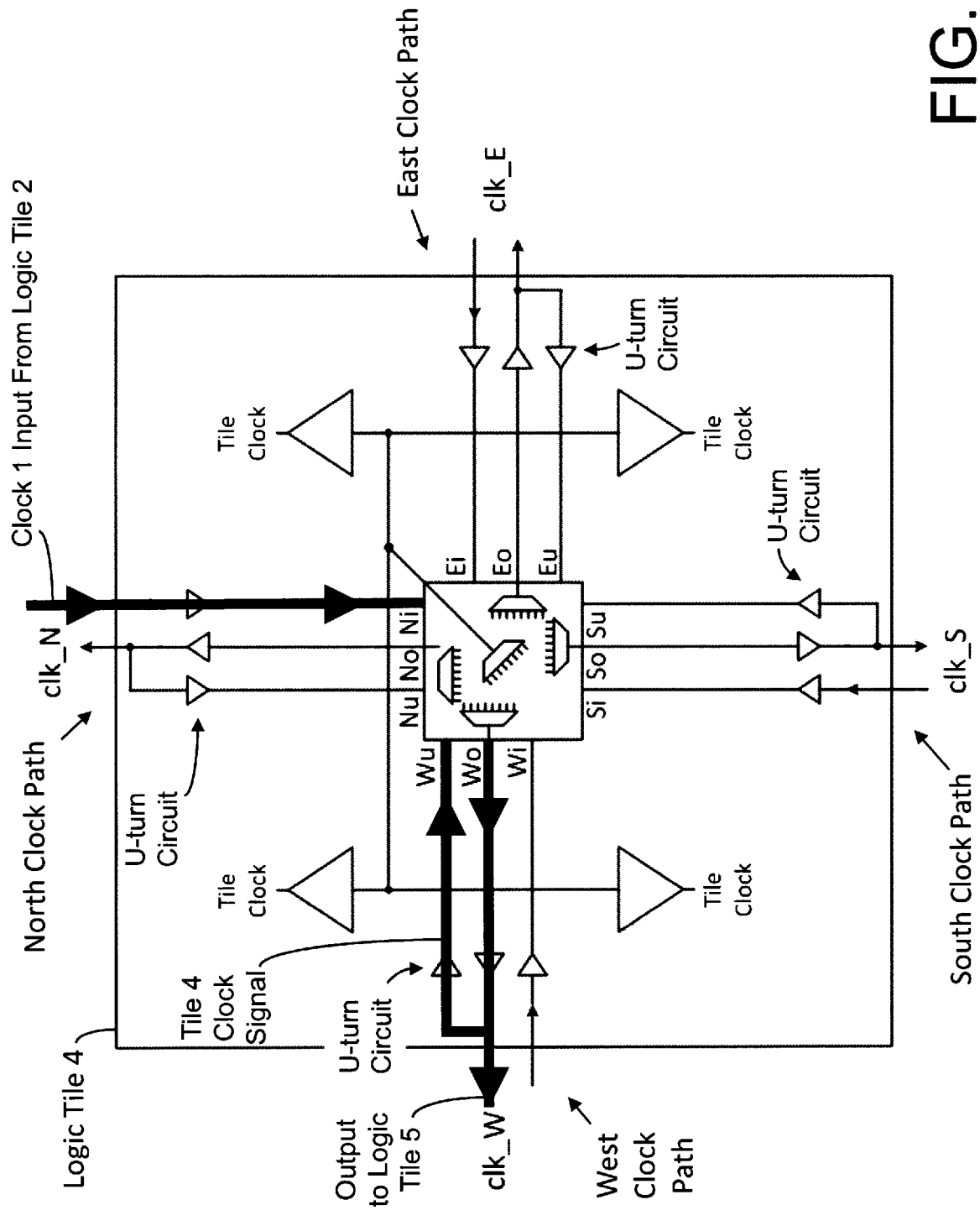
FIGS. 5A and 5B illustrate block diagram representations of exemplary embodiments of clock distribution and transmission circuitry of Logic Tile 4 of the exemplary architecture of, for example, FIGS. 4A and 4B, respectively, wherein in these exemplary embodiments, the clock distribution and transmission circuitry may employ zero, one or more u-turn circuits associated with the west clock path (and thereby incorporate sufficient clock or signal delay) to generate Tile Clock Signal 4 (having the appropriate or programmable skew relative to the tile clock signals of other logic tiles (here, substantially no or zero skew)—see, for example, FIGS. 4A and 4B); the Tile Clock Signal 4, in this embodiment, generates one or more Tile Clocks employed by, for example, the logic circuitry (and memory) to implement functions or operations of the logic tile and/or synchronize communication with other logic tiles and/or the external inputs and outputs of the programmable/configurable logic circuitry.
Figure 5B:
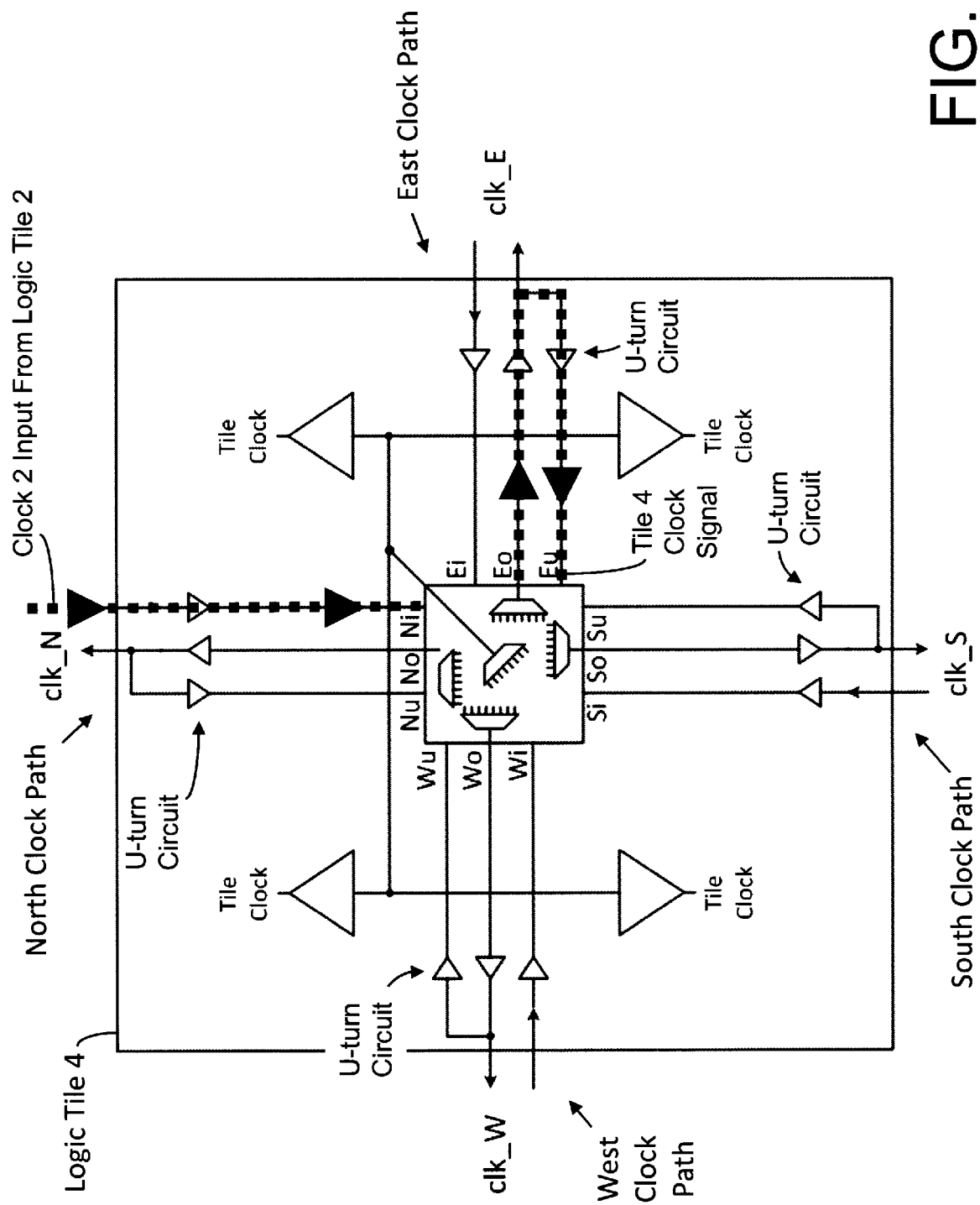

In the exemplary embodiment of FIG. 4B, a clock signal input (labeled "Clock 2 Signal") is applied to and received by Logic Tile 2, which incorporates two u-turn circuits in generating Tile 2 Clock Signal. The total delay introduced by Logic Tile 2 is 5 units. Further, the clock generation path associated with Tile 1, which incorporates one u-turn circuit in generating Tile 1 Clock Signal (thereby providing a total delay of 5 units—2 unit in Logic Tile 2 and 3 units on Logic Tile 1). The Tile Clock Signals of Logic Tiles 3-5 also include a total delay of 5 units. In this way, the Tile Clock Signals of the Logic Tiles of FIG. 4B have substantially no skew there between (in this exemplary embodiment, each include 5 units of delay in the clock generation path, where each unit represents the equivalent delay of 1 clock branch, which in this exemplary embodiment is the delay of one clock buffer plus its associated wire/conductor routing).

With reference to FIGS. 3D-3G and 6A-6C, in one embodiment, all of the logic tiles of, forming or on one or more (or all) of a perimeter of an array of logic tiles receives the same clock signal (or a derivative clock signal thereof). For example, with reference to FIGS. 3D, 3E, 6A and 6B, in one embodiment, logic tiles disposed on or form opposing perimeters of the array of logic tiles include clock signal inputs to receive the same clock signal, and distribute and/or transmit the clock signal to neighboring logic tiles in the associated row of the array of logic tiles (see Sides B and D of FIGS. 3D and 6A) or the associated column of the array of logic tiles (see Sides A and C of FIGS. 3E and 6B). The clock distribution and transmission circuitry of the logic tiles implement delay matching of the clock signal transmitted or distributed from a neighboring logic tile to neighboring logic tile of associated rows and associated columns. For example, with reference to FIG. 3D, Logic Tile 2 receives a clock signal (i.e., Clock 1 Signal) from neighboring Logic Tile 1 and from Logic Tile N via the logic tiles of Row 1 which are disposed between Logic Tile N and Logic Tile 2. The clock distribution and transmission circuitry of Logic Tile 2 implements suitable delay matching of the Clock 1 Signal received from Side D (i.e., Logic Tile 1) and/or implements suitable delay matching of the Clock 1 Signal received from Side B (i.e., Logic Tile N via the logic tiles disposed therebetween). Using one or more of the delay matched clock signal, the clock distribution and transmission circuitry in each logic tile of the array generates one or more local clock signals (i.e., one or more tile clocks) that are synchronous and have substantially no or zero skew and/or phase difference relative to the clock signals generated and employed in or by other logic tiles of the array of logic tiles of the integrated circuit.

In one embodiment, the logic tiles may employ the clock signals that are input to logic tiles located on both opposing sides of the logic tile array to generate one or more local clocks. For example, with reference to FIGS. 3D and 7A, Logic Tile 2 receives a clock signal (Clock 1 Signal) from both Side B and Side D. The Clock Distribution and Transmission Circuitry of Logic Tile 2, after delay matching of the clock signal (relative to the other logic tiles of the array), may generate one or more local tile clocks based on and/or using one of the clock signal or both of the clock signals. For example, in one embodiment, the Clock Distribution and Transmission Circuitry of Logic Tile 2, after suitably delay matching of each of the clock signals received from the logic tiles of the associated row, electrically "shorts" the plurality of Clock 1 Signals to generate a local clock signal. That is, the clock distribution and transmission circuitry of the logic tiles includes a multiplexer to receive the delay matched clock signals (from the neighboring logic tiles in the (i) associated row and/or (ii) associated column) and electrically short the clock signals at the output of the multiplexer. (See, FIGS. 7B and 7C). Here, the multiplexer receives a plurality of clock signals at the inputs, each clock signal may be associated with a clock signal applied to a clock signal input to the array of logic tiles, wherein the control signals applied to the multiplexer, in operation, select two or more of the inputs to concurrently connect to the output such that at least two of the clock signals applied to the inputs of the multiplexer are, in operation, shorted at the output of the multiplexer. As discussed above, the local tile clock(s) may be employed by circuitry to perform or execute functions or operations with the logic tile.

Notably, the present inventions may employ multiplexers like those illustrated in FIGS. 4A and 4B of U.S. Pat. No. 9,786,361 wherein the multiplexers may be programmed so that a plurality of inputs are selected/enabled thereby concurrently connecting a plurality of multiplexer inputs to the multiplexer output via the input-output path(s) in or of the multiplexer. Here, the control signals applied to the selection inputs of the multiplexer independently control whether a given multiplexer input is connected to the output such that, in operation, more than one input (or all inputs) of the multiplexer may be concurrently connected to the output thereby electrically shorting the selected/enabled inputs at the output of the multiplexer.

In this exemplary embodiment, each of the logic tiles (e.g., Logic Tile 2) employs two delay matched clock signals to generate one or more tile clocks (having a desired or programmable skew (for example, substantially no or zero skew) and/or phase (for example, 0 degrees or 180 degrees) relative to the tile clocks of other logic tiles of the programmable/configurable logic circuitry) which may be employed (or a derivative thereof may be employed) by circuitry in the logic tile to facilitate implementation of functions or operations of the logic tile and/or communication. As such, in one embodiment, a two input multiplexer (N=2) may be implemented wherein both multiplexer inputs are selected/enabled thereby concurrently connecting the inputs to the output of the multiplexer via the input-output path(s) in or of the multiplexer and shorting such inputs at the output of the multiplexer. (See, FIGS. 7B and 7C).

Notably, in another embodiment, each of the logic tiles employs one of the delay matched clock signals to generate one or more tile clocks (having a desired or programmable skew (for example, substantially no or zero skew) and/or phase (for example, 0 degrees or 180 degrees) relative to the tile clocks of other logic tiles of the programmable/configurable logic circuitry) which may be employed to implement functions or operations of the logic tile and/or communication with other tiles or external to the array of logic tiles. As such, in this exemplary embodiment, a two input multiplexer (N=2) may be implemented wherein one of the inputs is selected and applied to the output of the multiplexer. (See, FIGS. 7B and 7C).

Figure 3A:
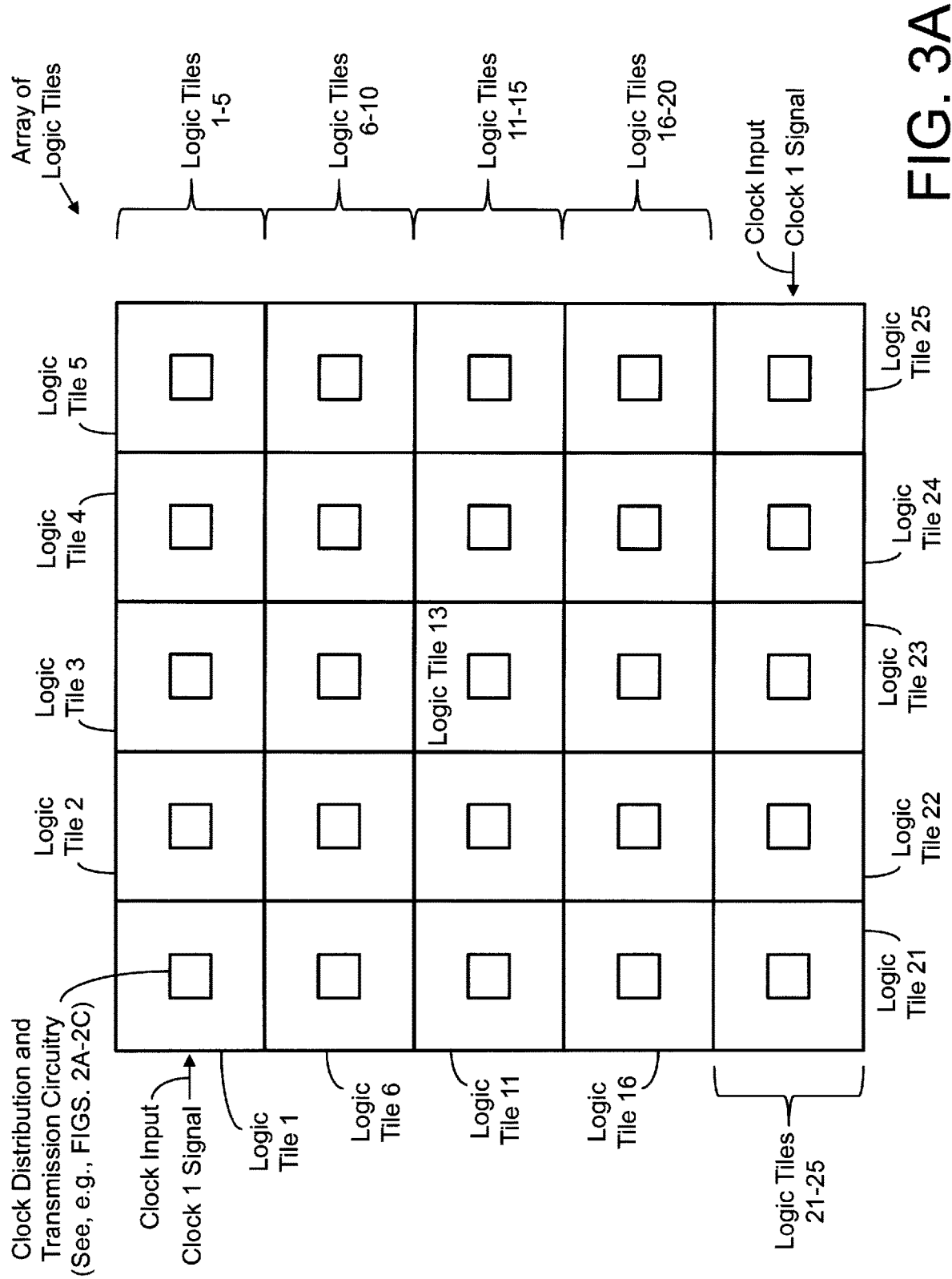
FIG. 3A illustrates a block diagram representation of an exemplary embodiment of a plurality of interconnected logic tiles of an exemplary 5×5 array of logic tiles of programmable/configurable logic circuitry, for example, an FPGA, according to at least one aspect of the present inventions, wherein, in this embodiment, the array of logic tiles includes a plurality of clock signal inputs (i.e., Clock Input of Logic Tile 1 and Clock Input of Logic Tile 25), each clock input is configured to receive a clock signal having known or predetermined characteristics (for example, frequency and phase) relative to the other clock signal(s) and, in one embodiment, each clock signal input is configured to receive the same clock signal (i.e., Clock 1 Signal) or a derivative clock signal; notably, each logic tile of the array includes clock distribution and transmission circuitry (illustrated by the block disposed within each logic tile block) which is capable of distributing the clock signal to one or more neighboring logic tiles and configured to generate a clock signal having characteristics which, in one embodiment, correlates to the clock signals of the other Logic Tiles (for example, includes same frequency and phase); as noted above, the tile clock signal, in one embodiment, is employed to generate a tile clock (see, FIGS. 2A-2C)
Figure 3B:
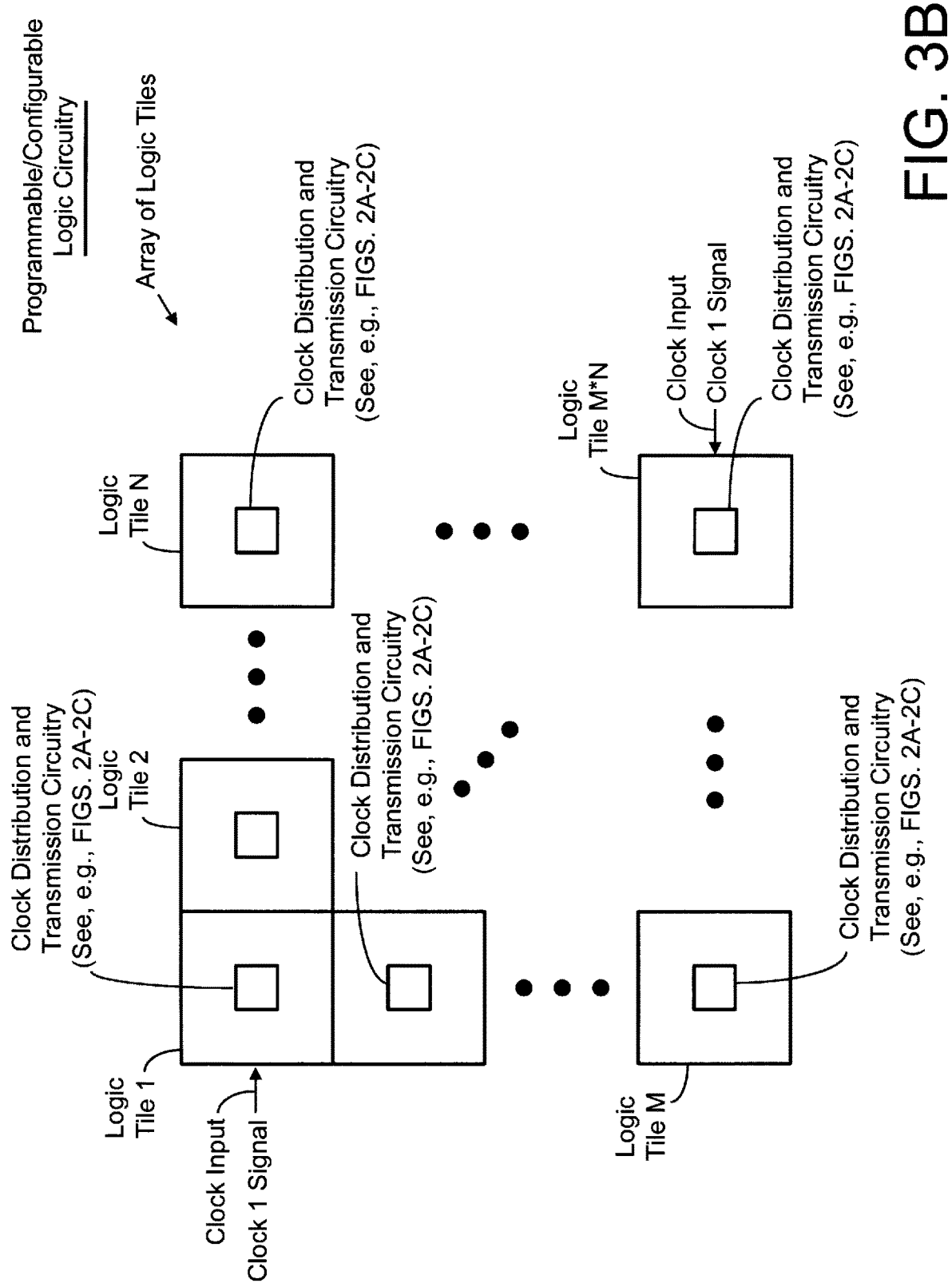
FIGS. 3B and 3C illustrate block diagram representations of a plurality of interconnected logic tiles of a M×N array of logic tiles of programmable/configurable logic circuitry, for example, an FPGA, according to at least one aspect of the present inventions, wherein, in this embodiment, the array of logic tiles includes a plurality of clock signal inputs (in FIG. 3B, Clock Input of Logic Tile 1 and Logic Tile M*N, and in FIG. 3C, Logic Tile N and Logic Tile M), each clock input is configured to receive a clock signal having known characteristics (for example, frequency and phase) relative to the other clock signal(s) and, in one embodiment, each clock signal input is configured to receive the same clock signal (i.e., Clock 1 Signal) or a derivative clock signal; notably, each logic tile of the array includes clock distribution and transmission circuitry (illustrated by the block disposed within each logic tile block) which is capable of distributing the clock signal to one or more neighboring logic tiles and configured to generate a clock signal having characteristics which, in one embodiment, correlates to (for example, includes same frequency and phase) the clock signals of the other Logic Tiles; as noted above, the tile clock signal, in one embodiment, is employed to generate a tile clock (see, FIGS. 2A-2C)
Figure 3C:
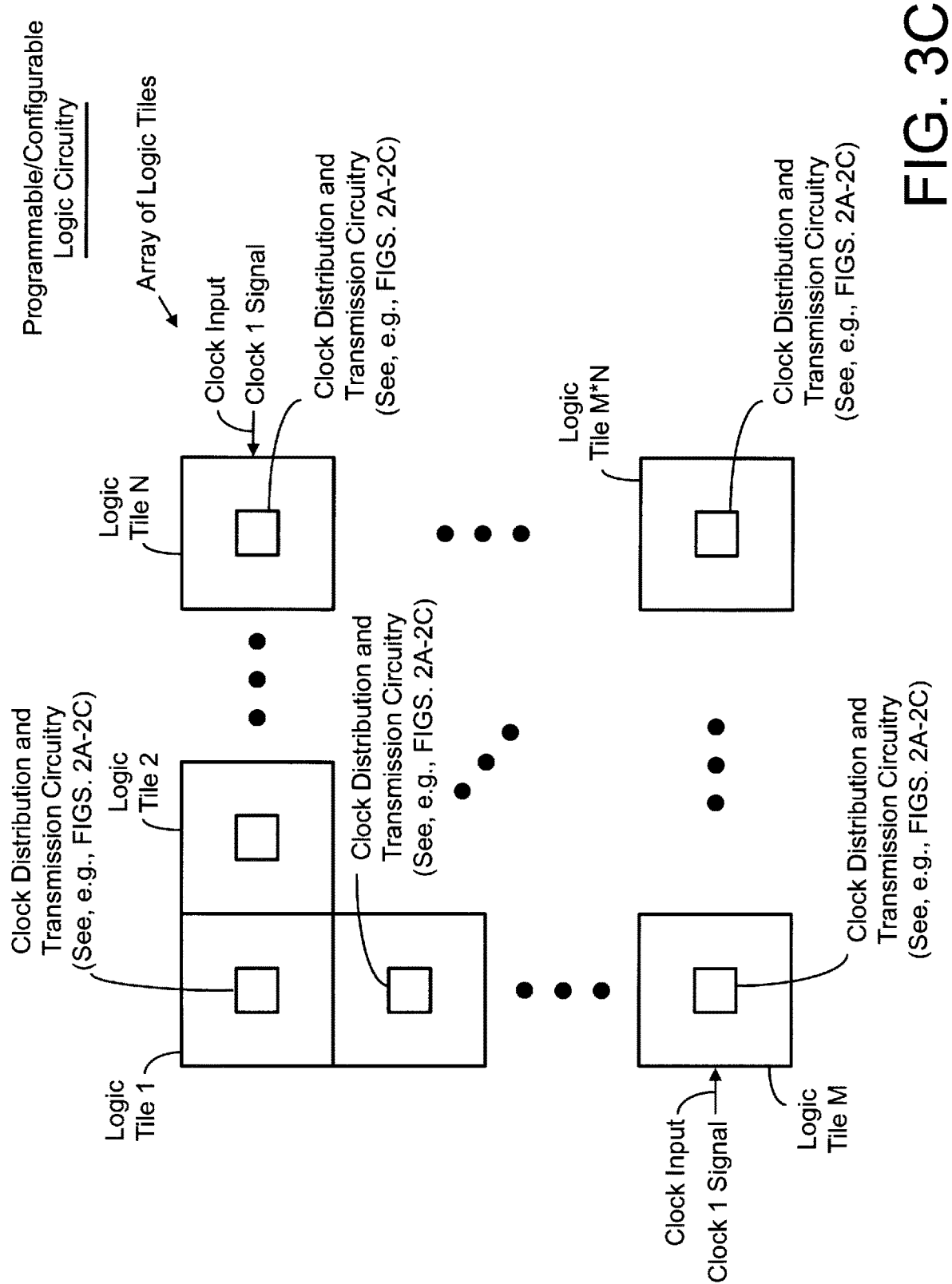
Figure 3D:
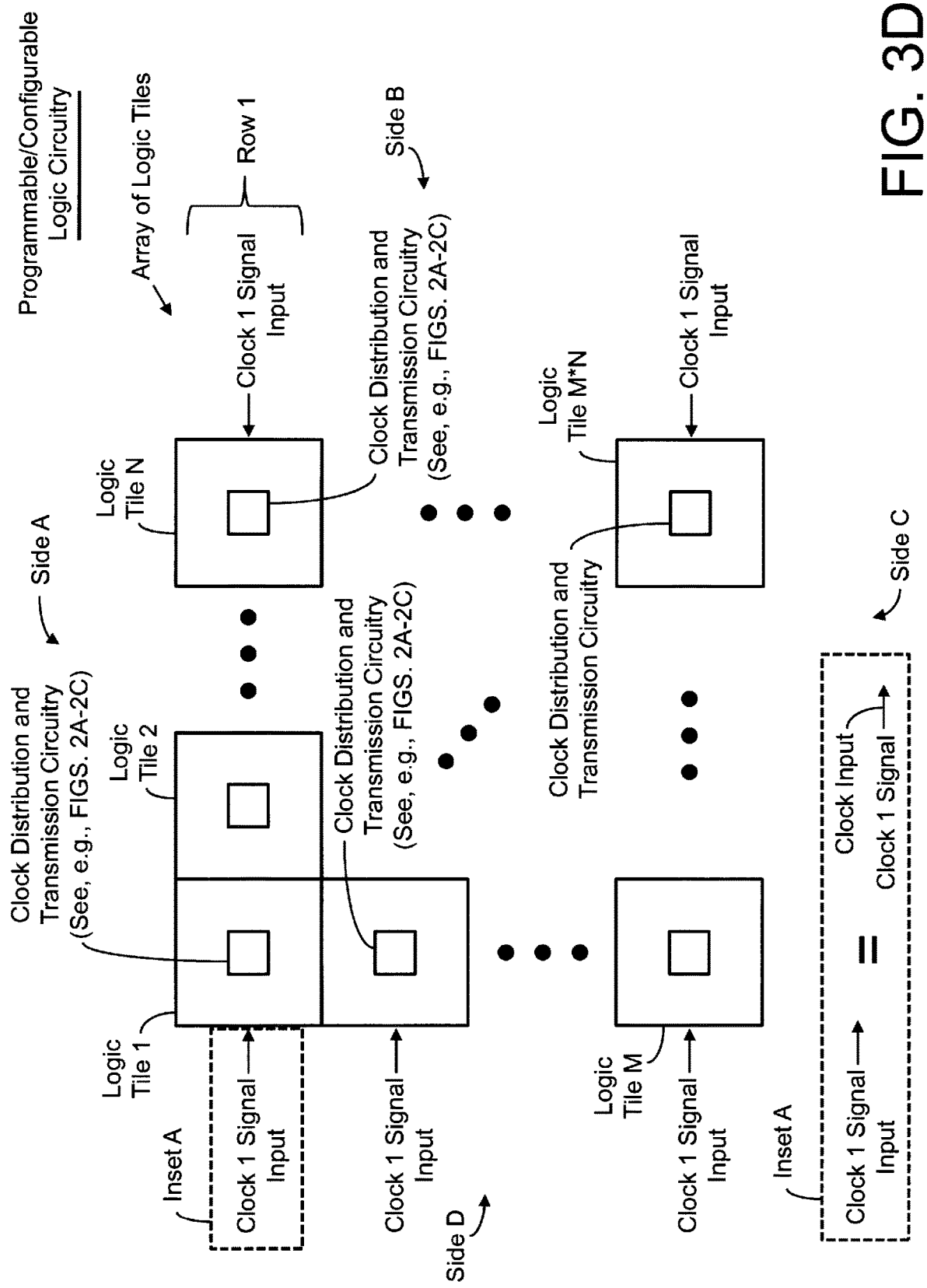
FIGS. 3D-3G illustrate block diagram representations of a plurality of interconnected logic tiles of a M×N array of logic tiles of programmable/configurable logic circuitry, for example, an FPGA, according to at least one aspect of the present inventions, wherein, in these embodiments, the array of logic tiles includes more than two clock signal inputs; as noted above, each clock input is configured to receive a clock signal having known characteristics (for example, frequency and phase) relative to the other clock signal(s) and, in one embodiment, each clock signal input is configured to receive the same clock signal (i.e., Clock 1 Signal) or a derivative clock signal; notably, each logic tile of the array includes clock distribution and transmission circuitry (illustrated by the block disposed within each logic tile block) which is capable of distributing the clock signal to one or more neighboring logic tiles and configured to generate a clock signal having characteristics which, in one embodiment, correlates to (for example, includes same frequency and phase) the clock signals of the other logic tiles of the array; as noted above, the tile clock signal, in one embodiment, is employed to generate a tile clock (see, FIGS. 2A-2C); for example, in one embodiment, each logic tile on the perimeter of opposing side of the array of logic tiles receives the clock signal and transmits or distributes the clock signal to the other logic tiles in the associated row (see FIG. 3D) or the associated column (see FIG. 3E); in another embodiment, each logic tile on the perimeter of the non-opposing sides of the array of logic tiles receives the clock signal and transmits or distributes the clock signal to the other logic tiles in the associated row and the associated column (see FIG. 3F); in yet another embodiment, each tile clock on the perimeter of all sides of the array of logic tiles receives the clock signal and transmits or distributes the clock signal to the other logic tiles in the associated row and the associated column (see FIG. 3G); notably, in one embodiment, the logic tiles of the array employ two or more of the clock signals (e.g., two or more Clock 1 Signals received from different clock signal inputs) to generate a generate a tile clock (i.e., a local clock for that logic tile) having a desired or programmable skew (for example, substantially no or zero skew) and/or phase (for example, 0 degrees or 180 degrees) relative to the tile clocks of other logic tiles of the programmable/configurable logic circuitry; as noted above, the tile clock may be employed by, for example, the logic circuitry (and/or memory) to implement functions or operations of the associated logic tile and/or synchronize communication with other tiles and/or the external inputs and outputs of the programmable/configurable logic circuitry.
Figure 3E:
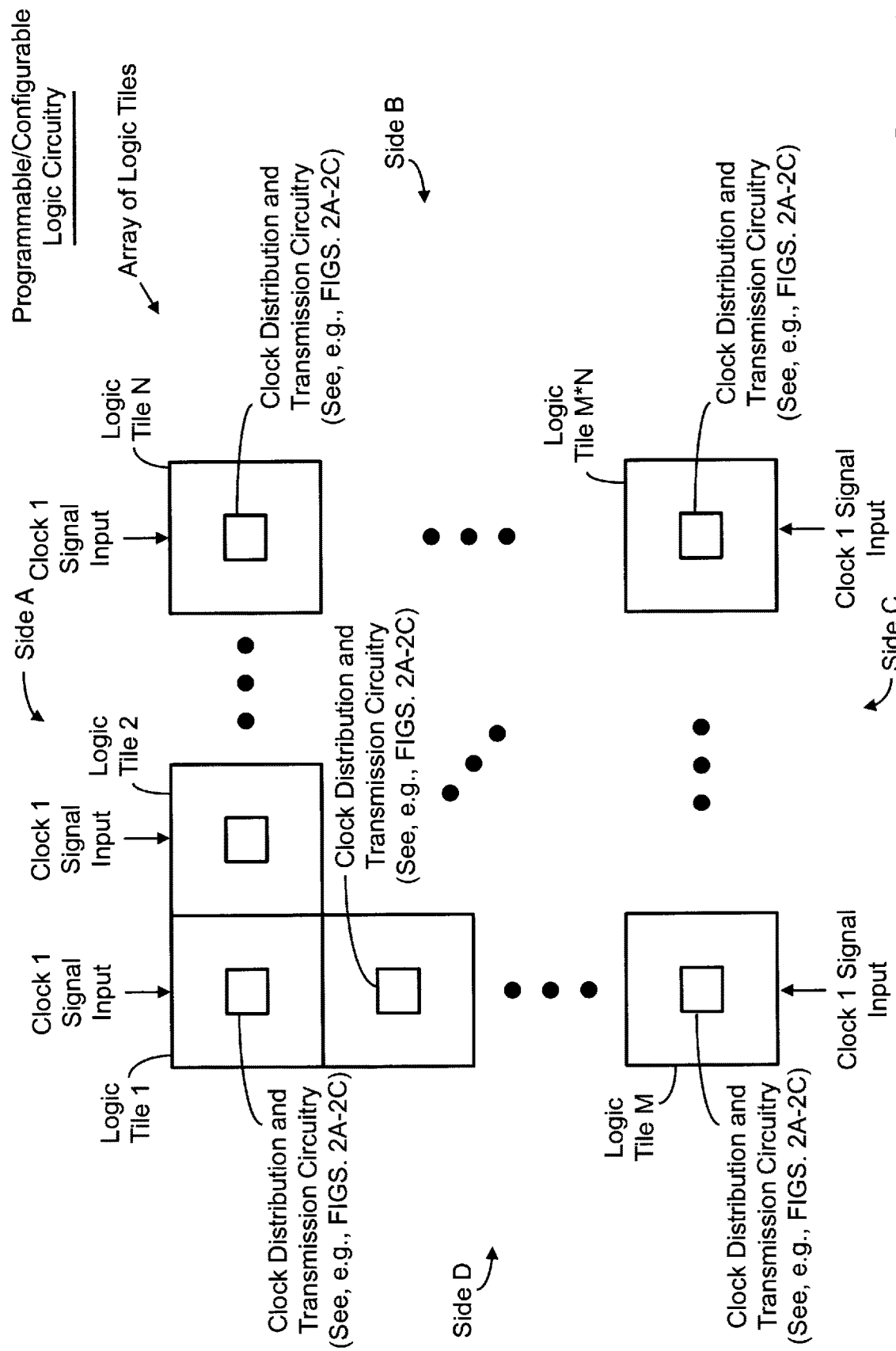
Figure 3F:
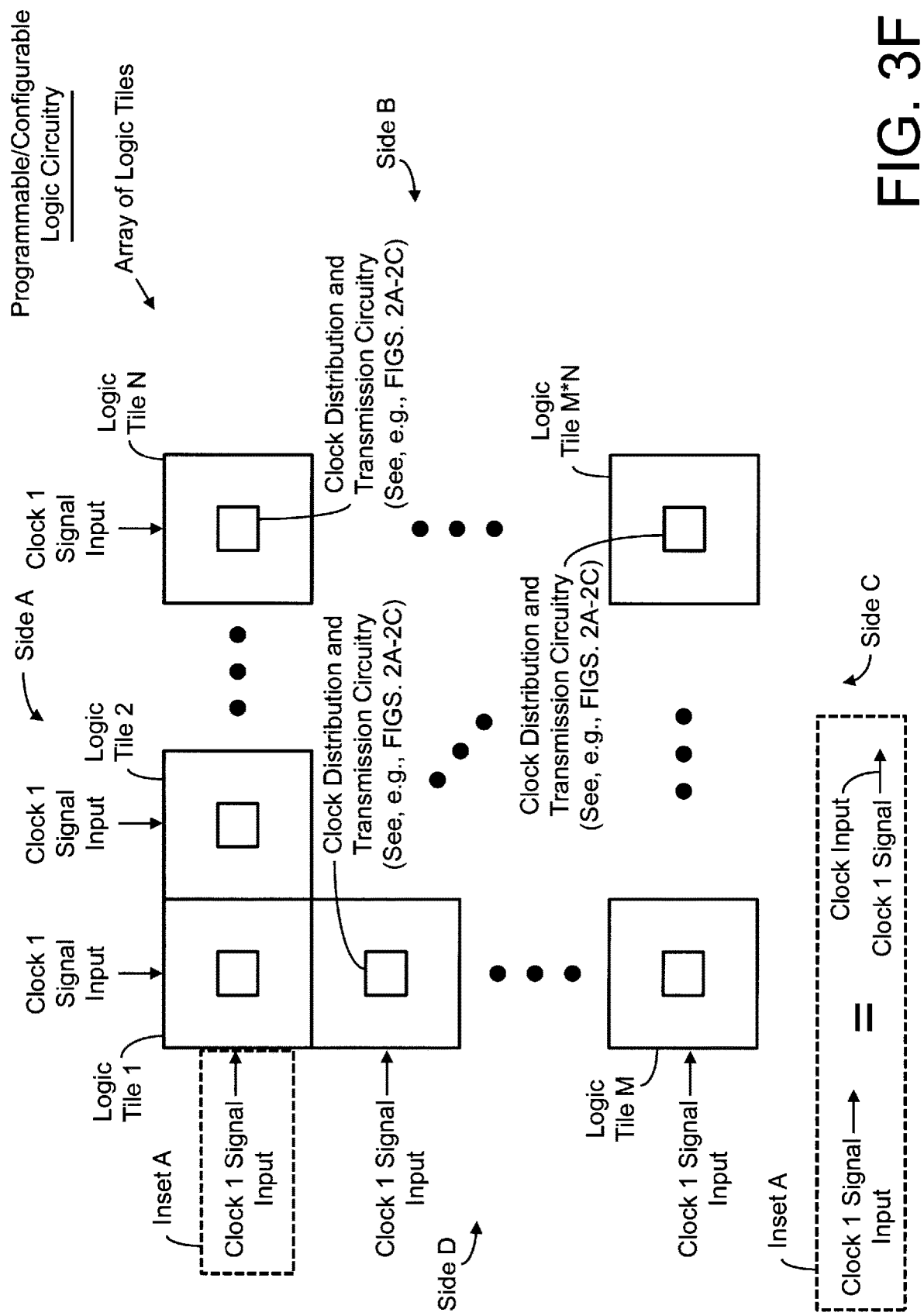

With reference to FIGS. 3F and 6C, in another embodiment, all of the logic tiles of, forming or on one or more (or all) of the perimeters of an array of logic tiles on two non-opposing perimeters of the array of logic tiles receive the clock signal. (See, for example, Sides A and D of FIG. 3F, and Sides A and B of FIG. 6C). In this embodiment, the clocks signals are input to the logic tiles forming or on the perimeters of Sides A and D of the array of FIG. 3F, and distributed and/or transmitted to neighboring logic tiles in/of the associated rows of logic tiles of the array of logic tiles (for example, from Logic Tile 1 to Logic Tile 2, etc., to Logic Tile N) and to neighboring logic tiles in/of the associated columns of the array (for example, from Logic Tile 1 to all of the Logic Tiles in the same column— including Logic Tile M). The clock distribution and transmission circuitry of each logic tile of the Logic Tile Arrays of FIGS. 3F and 6C, in addition to implementing delay matching of the clock signal transmitted or distributed from logic tile to logic tile to reduce the skew and/or phase difference relative to the clock signals generated and employed in or by other logic tiles of the array, generates a local clock signal using the clocks signals that are distributed and/or transmitted both (i) to/from logic tiles in the same/associated row and (ii) to/from logic tiles in same/ associated the column. (See, for example, FIG. 7A). Here, tile clock generation circuitry of the clock distribution and transmission circuitry of each logic tile, generates one or more local tile clocks based on and/or using the delay matched clock signals input into the array of logic tiles. Such local tile clock(s) (i.e., Tile Clock(s)), as discussed above, may be employed by circuitry to perform or execute functions or operations with the logic tile.

For example, similar to the embodiments of FIGS. 3D 3E, 6A and 6B, in one embodiment, the Clock Distribution and Transmission Circuitry of Logic Tile 1, after delay matching of the Clock 1 Signal to reduce or eliminate skew and/or phase difference relative to the clock signals (i.e., delay match the clock signals), may "short" the clock signals to generate a clock signal based on both delay matched Clock 1 Signals. With reference to FIGS. 7B and 7C, the clock distribution and transmission circuitry in the logic tiles may include one or more multiplexers to receive the delay matched clock signals (from the neighboring logic tiles in the (i) associated row and (ii) associated column) and electrically short the clock signals at the multiplexer output. In operation, the multiplexer receives a plurality of clock signals at the inputs, each clock signal may be associated with a clock signal applied to a clock signal input to the array of logic tiles, wherein the control signals applied to the multiplexer, in operation, select two or more of the inputs such that at least two of the clock signals applied to the inputs of the multiplexer are, in operation, shorted at the output of the multiplexer.

Again, each of the logic tiles (e.g., Logic Tile 1) employs at least two delay matched clock signals to generate one or more local clock signals which may be employed (or a derivative thereof may be employed) by circuitry in the logic tile to facilitate implementation of functions or operations of the logic tile and/or communication. As such, a two input multiplexer (N=2) may be implemented. (See, FIGS. 7B and 7C).

Notably, the delay matching of the clock signals received or employed by any particular logic tile may be implemented via "input/output path(s)" in or of that particular logic tile and/or via "input/output path(s)" in or of other logic tiles of the array. For example, with reference to FIG. 6A, in one embodiment, Logic Tile 1 provides a signal to Logic Tile 2 having a delay of 2 horizontal "input/output path(s)" and receives a signal from Logic Tile 2 having a delay of 6 horizontal "input/output path". Logic Tile 1 further incorporates 1 additional horizontal "input/output path" delay into the received signal to delay match Clock Signal 1 by a total of 7 horizontal "input/output path" delays. Here, the logic tiles in all of the columns delay matches Clock Signal 1 by 7 horizontal "input/output path" delays in order to generate, provide and/or employ a zero (or substantially zero) skew relative to the tile clock signals used by the other logic tiles in the associated row (e.g., Logic Tile 2, Logic Tile 3 and Logic Tile 4). The other rows of logic tiles of the array implement the same delay matching.

Figure 6A:
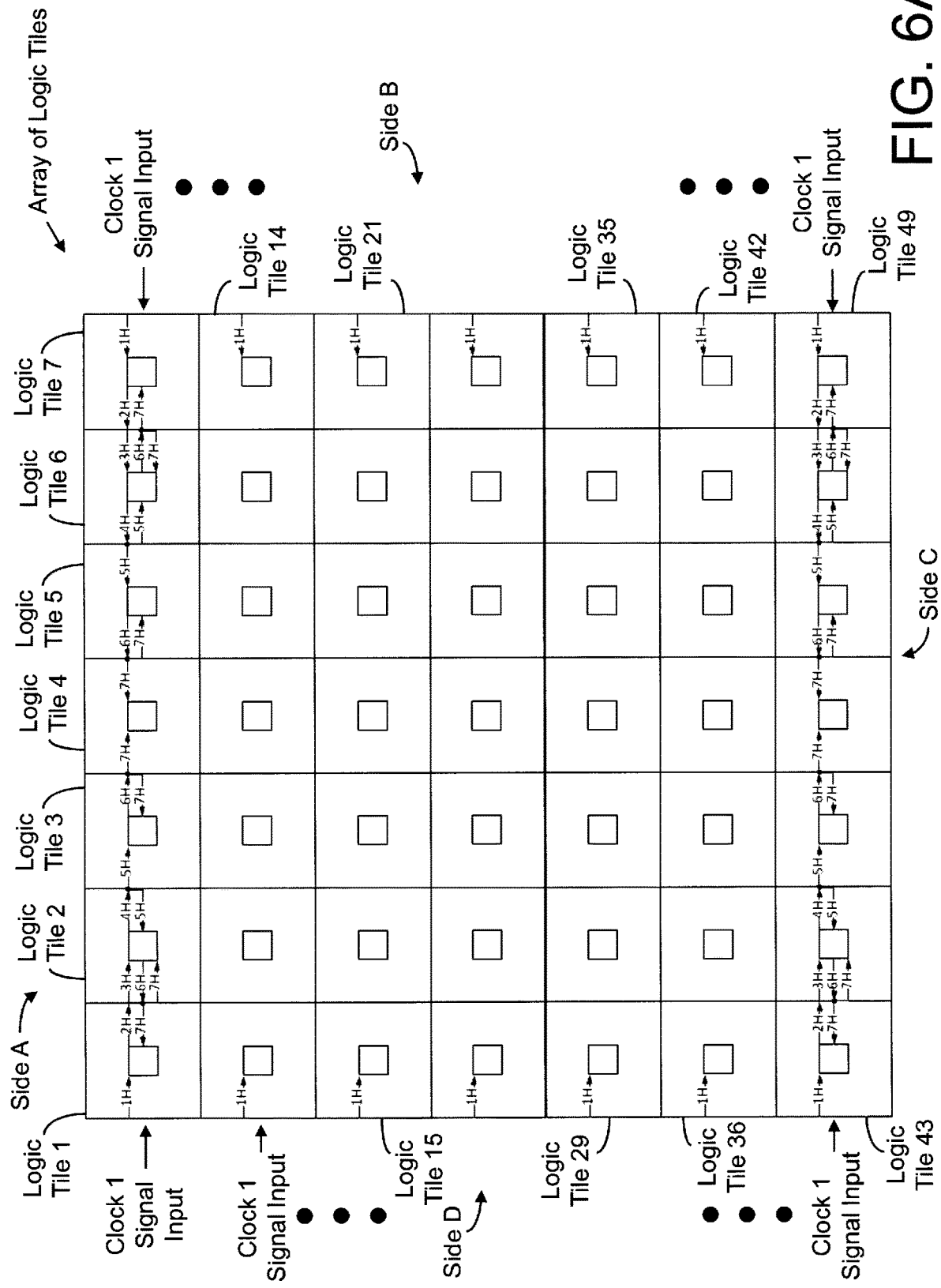
FIG. 6A illustrates a block diagram representation of an exemplary embodiment of a plurality of interconnected logic tiles of an exemplary 7×7 array of logic tiles of programmable/configurable logic circuitry, for example, an FPGA, according to at least one aspect of the present inventions, wherein, in this embodiment, the array of logic tiles includes a plurality of clock signal inputs at each of the logic tiles located on the peripheries or perimeters of two opposing sides of the array of logic tiles; in this embodiment, the clock signal is transmitted or distributed to/from neighboring logic tiles in the associated row of array of logic tiles and delay matching the Clock 1 Signal by 7 "input/output paths" provides a zero (or substantially zero) skew relative to the tile clock signals of other logic tiles in the associated row; notably, where the horizontal input/output paths are not equal to the vertical input/output paths, delay matching the Clock 1 Signal by 7 horizontal "input/output paths" provides a zero skew relative to the tile clock signals of other logic tiles in the associated row; notably, the delay matching of the clock signals received or employed by any particular logic tile may be implemented via "input/output path(s)" in or of that particular logic tile and/or via "input/output path(s)" in or of other logic tiles of the array (e.g., Logic Tile 1 provides a signal having a delay of 2 horizontal "input/output path(s)" to Logic Tile 2 and, based on the signal provided, receives a signal from Logic Tile 2 having a delay of 6 horizontal "input/output path" from Logic Tile 2, and thereafter incorporates 1 additional horizontal "input/output path" delay into the path to delay match Clock Signal 1 by a total of 7 horizontal "input/output paths" to generate, provide and/or employ a zero (or substantially zero) skew relative to the tile clock signals used by the other logic tiles in the associated row (e.g., Logic Tile 2, Logic Tile 3 and Logic Tile 4)
Figure 6B:
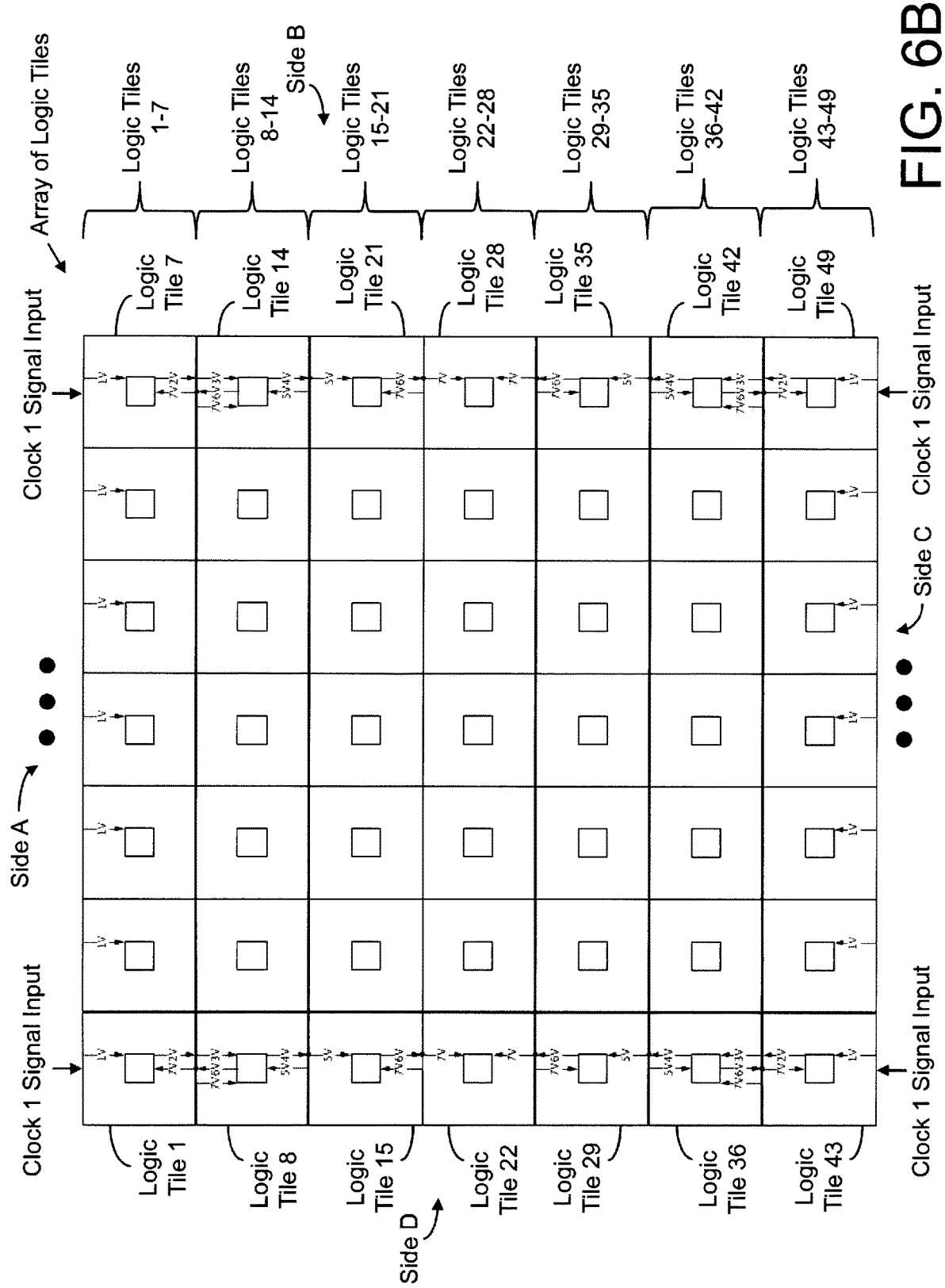
FIG. 6B illustrates a block diagram representation of a plurality of interconnected logic tiles of a 7×7 array of logic tiles of programmable/configurable logic circuitry, for example, an FPGA, according to at least one aspect of the present inventions, wherein, in this embodiment, the array of logic tiles includes a plurality of clock signal inputs at each of the logic tiles located on the peripheries of two opposing sides of the array of logic tiles that are different from the opposing sides at issue in FIG. 6A; in this embodiment, the clock signal is transmitted or distributed to/from neighboring logic tiles in the associated column of array of logic tiles and delay matching the Clock 1 Signal by 7 "input/output paths" provides a zero (or substantially zero) skew relative to the tile clock signals of other logic tiles in the associated column; as mentioned in the context of FIG. 6B, where the horizontal input/output paths are not equal to the vertical input/output paths, delay matching the Clock 1 Signal by 7 vertical "input/output paths" provides a zero skew relative to the tile clock signals of other logic tiles in the associated column; notably, the delay matching of the clock signals received or employed by any particular logic tile may be implemented via "input/output path(s)" in or of the particular logic tile and/or via "input/output path(s)" in or of other logic tiles of the array (e.g., Logic Tile 8 receives a signal, having 2 vertical "input/output path" delays from Logic Tile 1, and incorporates 5 additional vertical "input/output path" delays for a total delay of 7 vertical "input/output paths" whereas Logic Tile 15 receives a signal having a delay of 4 vertical "input/output paths" (that were introduced by "input/output paths" in Logic Tiles 1 and 8) and incorporates 3 additional vertical "input/output path" delays for a total delay of 7 vertical "input/output paths"; in this exemplary embodiment, each of Logic Tiles 8 and 15 (as well as the other tiles in the column) delay match Clock Signal 1 by a total of 7 vertical "input/output paths" in order to generate, provide and/or employ a zero (or substantially zero) skew relative to the tile clock signals used by the other logic tiles in the associated column (e.g., Logic Tile 1 and Logic Tile 22)

Similarly, with reference to FIG. 6B, Logic Tile 15 receives a signal, having a delay of 4 vertical "input/output paths" (that were incorporated via "input/output paths" in/of Logic Tiles 1 and 8) and further incorporates 3 vertical "input/output path" delays for a total delay of 7 vertical "input/output paths". Here, the logic tiles in all of the columns delay matches Clock Signal 1 by 7 vertical "input/ output path" delays in order to generate, provide and/or employ a zero (or substantially zero) skew relative to the tile clock signals used by the other logic tiles in the associated column. The other columns of logic tiles of the array implement the same delay matching.

Figure 3G:
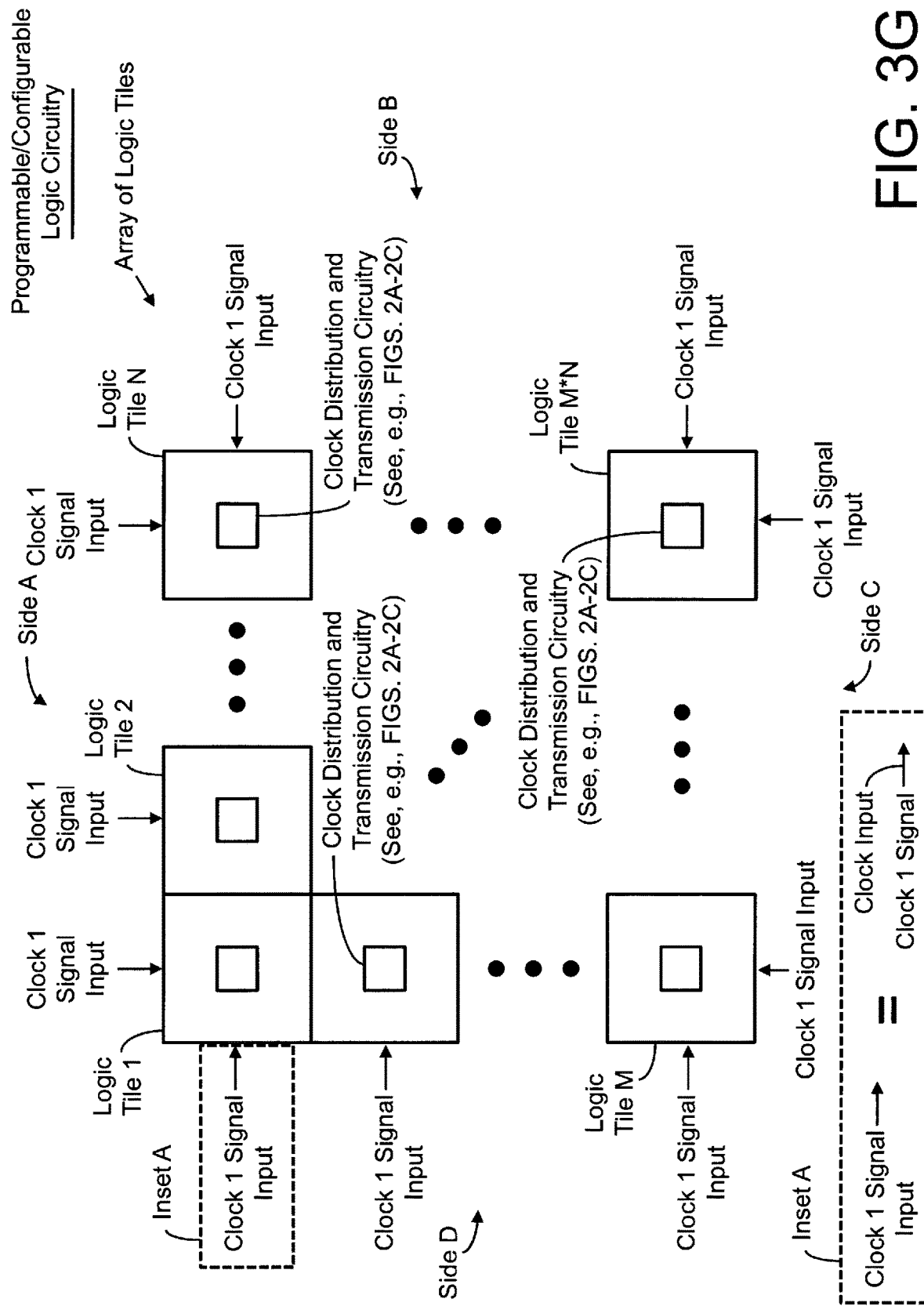

With reference to FIGS. 3G and 6D, in yet another embodiment, all of the logic tiles of, forming or on of the perimeter of an array of logic tiles include at least one clock input to receive a clock signal. In the illustrated embodiments, the clocks signals are input to the logic tiles forming or on the perimeters of Sides A, B, C and D of the logic tile array, and distributed and/or transmitted to neighboring logic tiles in/of the associated rows of logic tiles of the array of logic tiles and to neighboring logic tiles in/of the associated columns of the array. For example, with respect to the embodiment of FIG. 6D (which refers to FIGS. 6A and 6B), in the context of the row "direction" (see, FIG. 6A), a Clock 1 Signal is input into Logic Tile 1, a delayed version is transmitted to Logic Tile 2, a further delayed version is transmitted to Logic Tile 3, etc., wherein an even further delayed version is transmitted and received by Logic Tile 7. Similarly, the Clock 1 Signal is also input into Logic Tile 7, a delayed version is transmitted to Logic Tile 6, a further delayed version is transmitted to Logic Tile 5, etc., wherein an even further delayed version is transmitted to Logic Tile 1. In this embodiment, the clock signals are input to each of the logic tiles on the perimeter of each row of the array of logic tiles and, are thereafter, transmitted and/or distributed to respective neighboring logic tiles in/of the associated row. Thus, the clock signals input into the logic tiles on the perimeter are received, transmitted and/or distributed to neighboring logic tiles in/of the associated rows.

In the context of the column "direction" (see, FIG. 6B), the Clock 1 Signal is input into Logic Tile 1, a delayed version is transmitted to Logic Tile 8, further delayed version is transmitted to Logic Tile 15, etc., wherein an even further delayed version is transmitted and received by Logic Tile 43. Similarly, the Clock 1 Signal is also input into Logic Tile 43, a delayed version is transmitted to Logic Tile 36, a further delayed version is transmitted to Logic Tile 29, etc., wherein an even further delayed version is transmitted to Logic Tile 1. In this embodiment, the clock signals are input to each of the logic tiles on the perimeter of each column of the array of logic tiles and, are thereafter, transmitted and/or distributed to respective neighboring logic tiles in/of the associated row. Thus, the clock signals input into the logic tiles on the perimeter are received, transmitted and/or distributed to neighboring logic tiles in/of the associated columns.

With continued reference to FIGS. 3G and 6D, the clock distribution and transmission circuitry of each logic tile appropriately delay matches the clock signals received, transmitted and/or distributed from logic tile to logic tile to reduce or eliminate the skew and/or phase difference relative to the clock signals generated and employed in or by other logic tiles of the array. The tile clock generation circuitry of the clock distribution and transmission circuitry receives the delay matched clock signals and generates one or more local clock signals (tile clock(s)) using one or more (or all) of such clocks signals. (See, for example, FIG. 7A). That is, in one embodiment, the clock signals that are received, distributed and/or transmitted both (i) to/from logic tiles in the same row and/or (ii) to/from logic tiles in same the column are employed to generate one or more local clock signals.

For example, with reference to FIG. 3G, Logic Tile 1 may generate a local tile clock using the Clock 1 Signal input from Side A (after appropriate delay matching), the Clock 1 Signal input from to Logic Tile N on the perimeter of the array of Side B (again, after appropriate delay matching), the Clock 1 Signal input from to Logic Tile M on the perimeter of the array of Side C (again, after appropriate delay matching), and Clock 1 Signal input from Side D (after appropriate delay matching). Here, tile clock generation circuitry of Logic Tile 1 generates the tile clock based on and/or using the four delay matched clock signals (for example, via the circuitry of FIGS. 7A, 7B and/or 7C). Such local tile clock, as discussed above, may be employed by circuitry in Logic Tile 1 to perform or execute functions or operations with the logic tile. Similar operations are implemented in each of the other Logic Tiles of the array of FIG. 3G. The same is the case in the logic tiles of the array of FIG. 6D. That is, tile clock generation circuitry of the clock distribution and transmission circuitry of each logic tile generates a local clock signal using the clocks signals that are distributed and/or transmitted (i) from both opposing sides to/from logic tiles in the same row and (ii) from both sides to/from logic tiles in the same column. As described above, in one embodiment, the clock signal received, transmitted or distributed to/from logic tile in the row direction, after delay matching, and the clock signal transmitted or distributed to/from logic tile in the column direction, after delay matching, are employed by the tile clock generation circuitry to generate (for example, in one embodiment, electrically "shorted"—see FIGS. 7B and 7C) one or more local clock signals.

Notably, in one embodiment, the logic tiles of embodiment illustrated in FIGS. 3G and 6D need not employ all of the input clock signals (i.e., in this illustrated embodiment the four clock signals input into the logic tiles of, forming or on of the perimeter of an array of logic tiles). In this regard, the tile clock generation circuitry of the clock distribution and transmission circuitry of each logic tile may employ one, two, three or four of the clock signals input into the array to generate one or more local clock signals. That is, the circuitry of the clock distribution and transmission circuitry of each logic tile may employ one, two, three or four of the delay matched clock signals received by the clock distribution and transmission circuitry of the logic tile in the generation of the local clock signal(s).

Thus, in this embodiment, clock distribution and transmission circuitry of the logic tile may generate a local clock signal using the clocks signals that are distributed and/or transmitted (i) from one or both opposing sides to/from logic tiles in the same row and/or (ii) from one or both sides to/from logic tiles in the same column (i.e., four delay matched clock signals). Like that described above, on a tile-by-tile basis, the two clock signals transmitted or distributed to/from logic tile in the row direction (one clock signal transmitted or distributed from each side of the array along the associated row), and after delay matching, one or both are employed to generate one or more local clock signal which is/are employed (or a derivative thereof is employed) by circuitry in the logic tile. Similarly, two clock signal are transmitted or distributed to/from logic tile in the column direction (one clock signal transmitted or distributed from each side of the array along the associated column), wherein after delay matching, one or both are employed to generate one or more local clock signal which is/are employed (or a derivative thereof is employed) by circuitry in the logic tile. For example, in one embodiment, two, three or four of the delay matched clock signals are "shorted" to generate one or more local clock signals (for example, tile clocks of the associated logic tile). (See, for example, FIG. 7A as well as the multiplexers of FIGS. 7B and 7C).

Notably, in one embodiment, all clock signals are shorted together using the same circuitry (for example, one multiplexer). In another embodiment, the delay matched clock signals from the row direction are shorted and the delay matched clock signals from the column direction are separately shorted and thereafter, the shorted signals from the row direction and the shorted signals form the column direction are then shorted to generate one or more local clock signals. It should be noted that all combinations and permutations as well as circuitry and techniques for shorting the clock signals are intended to fall within the scope of the present inventions.

The layout of the clock distribution and transmission of the one, some or all of the logic tiles of the programmable/configurable logic circuitry may provide a desired or programmable skew of two or more of the same or different input clock signals. In one embodiment, the clock distribution and transmission circuitry in one or more logic tiles may generate local clock signals associated with more than one input clock wherein the local clock signals associated with each input clock are synchronous and have substantially no or zero skew relative to the tile clock signals employed in or more other logic tiles of the programmable/configurable logic circuitry. In another embodiment, the clock distribution and transmission circuitry in one or more logic tiles may generate asynchronous local clock signals which have fixed or programmable skew relative to the tile clock signals employed in or more other logic tiles of the programmable/configurable logic circuitry. Notably, with respect to each logic tile, the tile clocks generated based on an input clock may be synchronous or asynchronous relative to the tile clocks generated based on another, different input clock.

Figure 8:
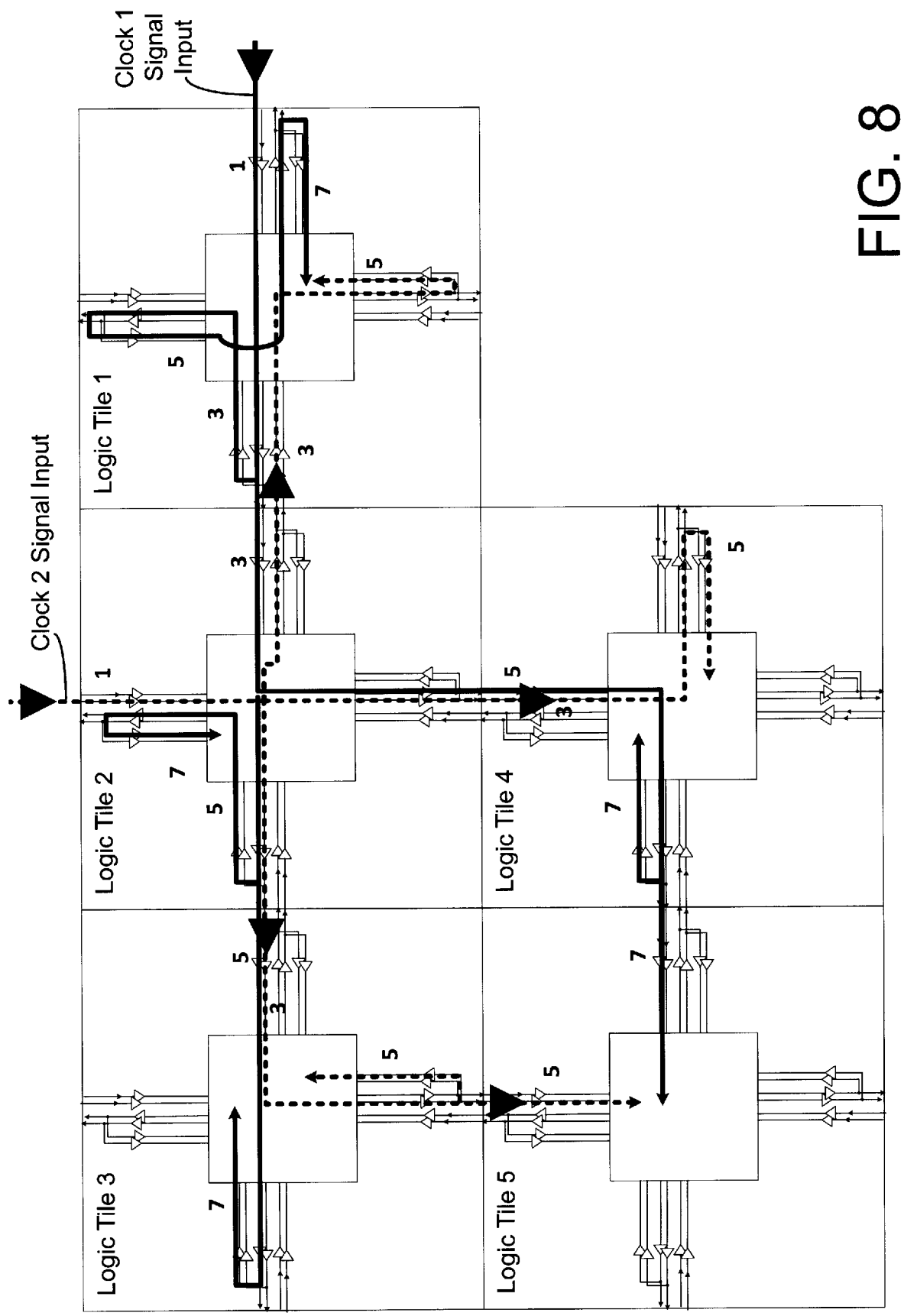
FIG. 8 illustrates an exemplary block diagram representation of a plurality of interconnected logic tiles (of the type illustrated in FIG. 2B) of, for example, an FPGA, wherein each logic tile includes a plurality of inputs/outputs at each input/output path (here, two); in this exemplary embodiment, Logic Tiles 1-5 receive and distribute/output two clock signals (i.e., Clock 1 Signal and Clock 2 Signal—which may be the same clock signal (i.e., have the same characteristics such as frequency and phase)) which are distributed to/from the logic tiles, and via the exemplary clock distribution and transmission circuitry of each logic tile, to generate tile clock signals associated with each of the clock signals for the logic tiles as illustrated in FIGS. 2A-2C; the exemplary clock distribution and distribution path, and direction thereof, is indicated by the bold solid or dashed lines and the arrows wherein the clock distribution and transmission circuitry of each logic tile is configured or programmed to provide that clock distribution and distribution path that provides the programmed relationship of the tile clock signals (for example, substantially no or zero skew) that are employed by the logic tiles; in the exemplary embodiment Clock 1 is input to Logic Tile 1 and Clock 2 is input is to Logic Tile 2; in both instances, the clock signals are distributed/routed to incorporate a delay that provides a predetermined relationship of the clock signal employed internally by Logic Tiles 1-5 (and potentially one, some or all of the other Logic Tiles of the programmable/configurable logic circuitry); as noted herein, Clock 1 may be the same clock signal as Clock 2 (i.e., have the same characteristics such as frequency and phase) and may be generated and output by the timing circuitry (see, FIG. 1A)
Figure 9:
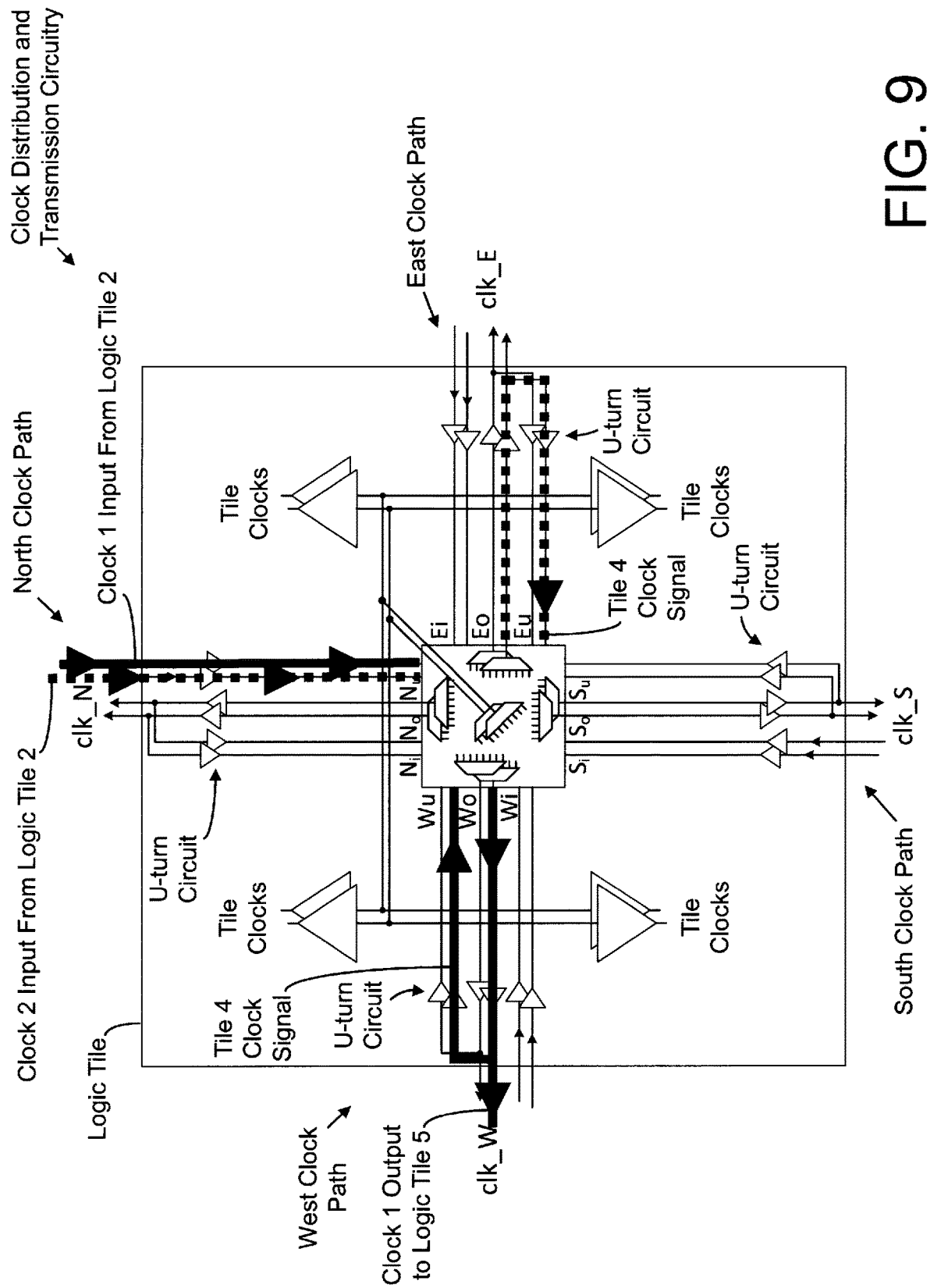
FIG. 9 illustrates block diagram representations of an exemplary clock distribution and transmission circuitry of Logic Tile 4 of the exemplary architecture of FIG. 8, wherein in this exemplary embodiment, the clock distribution and transmission circuitry may employ zero, one or more u-turn circuits associated with the west clock path to generate Tile Clock Signal 4 (having the appropriate or programmable skew relative to the tile clock signals of other logic tiles (here, substantially no or zero skew); the clock distribution and transmission circuitry of Logic Tile 4 includes a plurality of inputs/outputs at each input/output path (in this exemplary embodiment two) which are employed to generate one or more Tile Clocks associated with either Clock 1 or Clock 2; such tile clocks may be synchronous or asynchronous, for example, based on whether Clock 1 and Clock 2 are synchronous or asynchronous; each Tile Clock may be employed by, for example, the logic circuitry (and memory) to implement functions or operations of the logic tile and/or communication with other tiles and/or the external inputs and outputs of the programmable/configurable logic circuitry.

In particular, with reference to FIGS. 8 and 9, in one embodiment, the clock distribution and transmission path for Logic Tiles 1-5 (which are the type of FIG. 2B or 2C) with respect to Clock 1 provides substantially no or zero skew between the Tile Clocks (associated with Clock 1) of the Logic Tiles 1-5. Similarly, clock distribution and transmission path for Logic Tiles 1-5 with respect to Clock 2 provides substantially no or zero skew between the Tile Clocks (associated with Clock 2) of the Logic Tiles 1-5. The clock signal distribution path, and direction thereof, for Clock 1 is indicated by the bold line and the arrows. The clock signal distribution path, and direction thereof, for Clock 2 is indicated by the dashed line and the arrows. In this embodiment, the clock distribution and transmission circuitry of each Logic Tile 1-5 is programmed to provide a Tile Clock Signal and/or Tile Signal in connection with Clock 1 that has substantially no or zero skew relative to the other Tile Clock Signals and/or Tile Signal, respectively, associated with Clock 1. Similarly, the clock distribution and transmission circuitry of each Logic Tile 1-5 is programmed to provide a Tile Clock Signal and/or Tile Signal in connection with Clock 2 that has substantially no or zero skew relative to the other Tile Clock Signals and/or Tile Signal, respectively, associated with Clock 2.

Thus, in those embodiments where one or more logic tiles receive, transmit, distribute and generate a plurality of different clock signals—based on different input clocks, the clock distribution and transmission circuitry of each Logic Tile may employ a plurality of input and output clock buffers of each path to generate and distribute such clocks. In this exemplary embodiment, each tiles generates, distributes and supports two tile output clocks, two tile input clocks, and two tile u-turn circuits for each clock path, and, as such, each logic tile propagates two independent clock signals to those pertinent tiles and generate two local clocks (Tile Clock Signals corresponding to Clock 1 Signal Input and Clock 2 Signal Input—each employed to generate independent "Tile Clocks" for the associated logic tiles).

Notably, the Tile Clocks generated using the Clock 1 and/or Clock 2 may be employed to generate multiple synchronous or asynchronous Tile Clocks (based on Clock 1 and/or Clock 2) which are employed by, for example, the logic circuitry (and memory) to implement synchronous or asynchronous functions or operations of or in the logic tile and/or synchronous or asynchronous communication with other logic tiles and/or the external inputs and outputs of the programmable/configurable logic circuitry. Such synchronous or asynchronous clocks may be relative to Clock 1, or Clock 2, or Clock 1 and Clock 2

The techniques of the present inventions may be implemented using one or more processors (suitably programmed) to perform, execute and/or assess an architecture for clock distribution of one, some or all of the logic tiles of the programmable/configurable logic circuitry. The clock distribution architecture may selectively incorporate one or more (or none if appropriate) u-turn circuits into the clock signal path of one or more of the logic tiles to generate a tile clock signal having the desired or programmable skew relative to the tile clock signals of other logic tiles of the programmable/configurable logic circuitry of an integrated circuit.

Although the clock input signals, after delay matching, have been described, illustrated, configured and/or designed to provide substantially no skew there between, such signals may be configured or designed (and thereafter constructed) to include a predetermined or programmed clock skew relative to one or more clock signals of other logic tiles of the programmable/configurable logic circuitry of an integrated circuit. The architecture for clock distribution of one, some or all of the logic tiles of the programmable/configurable logic circuitry may be designed to provide a desired or programmable non-zero skew relative to the tile clock signals of other logic tiles of the programmable/configurable logic circuitry of an integrated circuit. Notably, the programmable skew may be fixed or programmable/variable (whether one time or multiple times), for example, during use (in situ) and/or based on one or more operating conditions. Moreover, programmable skew may be fixed and/or programmable after manufacture, deployment and/or during operation (for example, in situ by a user and/or operator of the electronic device associated with the control circuitry).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, in the illustrative exemplary embodiment, the clock circuitry is located "on-chip", for example, clock circuitry integrated in/on the die of the integrated circuit.

Such clock circuitry (for example, phase-locked-loop (PLL) circuitry and/or Delay-locked-loop (DLL) circuitry may be partially or entirely generated internal to or external from the programmable/configurable logic circuitry (for example, in one or more logic tiles). Alternatively, the clock circuitry may be partially or entirely off-chip and thereby external to the die of the integrated circuit. Regardless, the clock circuitry generates a clock signal that is employed by the one or more logic tiles of the programmable/configurable logic circuitry to generate tile clock signals for the associated logic tiles. The tile clock may be used by circuitry to facilitate orderly implementation of functions or operations of the logic tile and/or communication with other logic tiles and external inputs and outputs.

Moreover, although the u-turn circuits have been described and illustrated as being located at/in associated output paths, the u-turn circuits need not be located at/in and associated with an output path—but simply associated with the clock distribution and transmission circuitry of the logic tile.

Further, as intimated above, although each clock path of the logic tiles of FIGS. 2A-2C includes at least one u-turn circuit, one or more logic tiles may include clock paths that do not include u-turn circuits. Moreover, as indicated above, the u-turn circuits disposed at each of the output path may be the same or different type circuits—for example, at first output path, the u-turn circuit may consist of one buffer and, at a second output path, the u-turn circuit may consist of two or more buffers.

Indeed, the u-turn circuits in the logic tiles may be incorporated into the clock paths to program or balance clock skew and/or phase (for example, maintaining substantially no or zero skew) between clock signals of the logic tiles. Circuits or circuit configurations other than u-turn circuits may be employed to program or balance clock skew and/or phase by incorporating, matching or providing a programmable delay of the clock signals of the logic tiles.

Figure 10:
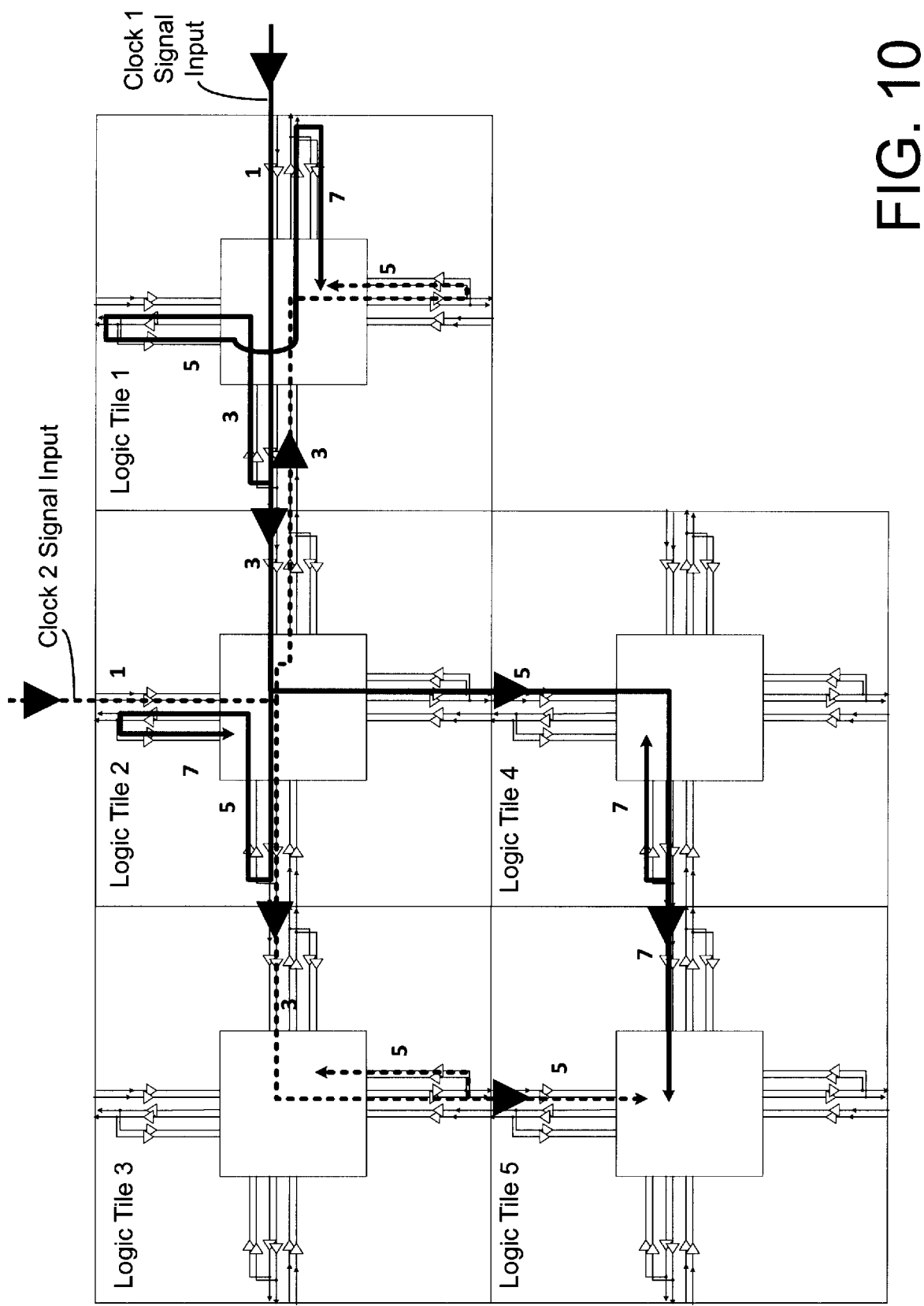
FIG. 10 illustrates a block diagram representation of a plurality of interconnected logic tiles (of the type illustrated in FIG. 2B) of, for example, an FPGA, wherein each logic tile includes a plurality of inputs/outputs at each input/output path (in this exemplary embodiment two); in this exemplary embodiment, Logic Tiles 1-3 each receive two clock signals (i.e., Clock 1 Signal and Clock 2 Signal) which are distributed to some but not all of the logic tiles; via the exemplary clock distribution and transmission circuitry of each logic tile, logic tiles generate tile clock signals associated with one or both of the clock signals; the exemplary clock distribution and distribution path, and direction thereof, is indicated by the bold solid or dashed lines and the arrows wherein the clock distribution and transmission circuitry of each logic tile is configured or programmed to provide that clock distribution and distribution path that provides the programmed relationship of the tile clock signals (for example, substantially no or zero skew) that are employed by the logic tiles; in the exemplary embodiment Clock 1 is input to Logic Tile 1 and Clock 2 is input is to Logic Tile 2; in both instances, the clock signals are distributed/routed to incorporate or create a delay that provides or generates a predetermined relationship of the clock signal employed internally by one some or all of Logic Tiles 1-5.

Moreover, although the clock distribution and transmission path for logic tiles for one or more of the programmable/configurable logic circuitry may generate independent tile clocks (using independent, for example, asynchronous input clocks), not all of the logic tiles of the programmable/configurable logic circuitry may generate and/or distribute such independent clocks. For example, with reference to FIG. 10, Logic Tile 3 does not generate one or more tile clocks corresponding to Clock 1 and Logic Tile 4 does not generate one or more tile clocks corresponding to Clock 2. Similarly, Logic Tile 2 does not generate one or more tiles clocks corresponding to Clock 2—however, the clock distribution path for Clock 2 includes Logic Tile 2.

Further, it may be advantageous to disable those buffers, transistors (and other active or passive elements) in non-selected portions of the clock path or portions of the clock distribution and transmission circuitry of logic tiles that are not incorporated into the clock distribution, generation and/or transmission path (hereinafter collectively, "non-selected circuitry"). For example, with reference to FIG. 9, the entire South Clock Path and/or the u-turn circuit and output buffer of the North Clock Path may be disabled (for example, permanently or if and until the clock path is reconfigured or reprogrammed—for example, in situ or during test). In one embodiment, the circuitry may be disabled by not propagating or providing power to such non-selected portions (for example, during design and/or manufacture). In another embodiment, the circuitry may be disabled via one or more control signals from, for example, the control circuitry.

Figure 11:
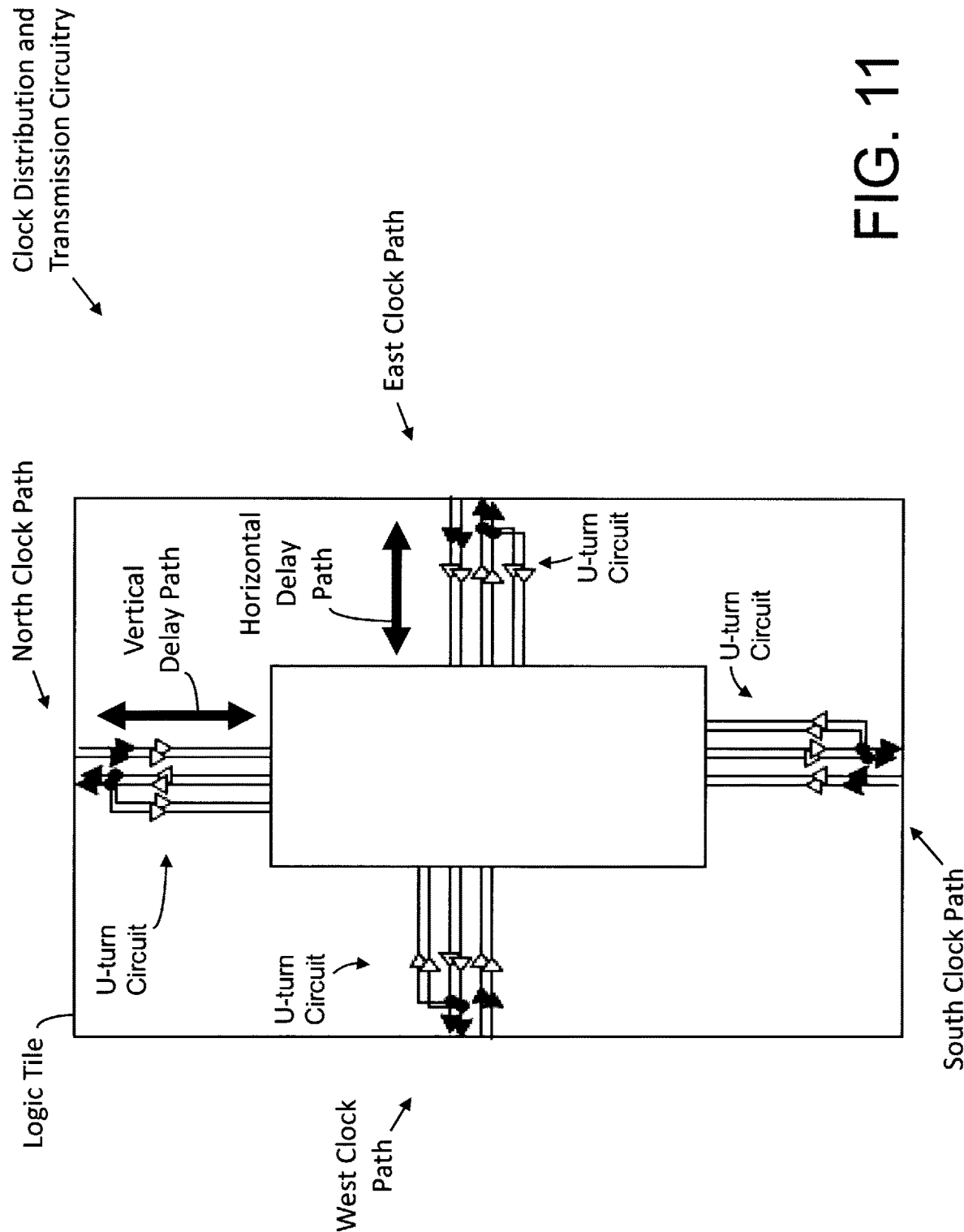
FIG. 11 illustrates a block diagram representation of an exemplary clock distribution and transmission circuitry of a rectangular-shaped logic tile wherein in this exemplary embodiment, the clock distribution and transmission circuitry includes a plurality of input and output paths (four paths in this illustrated embodiment—labeled "north clock path", "east clock path", "south clock path" and "west clock path") to generate tile clock signals having a desired or programmable skew and, in certain situations, to distribute or transmit one or more tile clocks or related clock signals to one or more neighboring logic tiles of the programmable/configurable logic circuitry; each of the input and output paths may include one input/output and u-turn circuit to introduce additional vertical and horizontal propagation delay components of the clock signal path (wherein the length of the vertical paths are different from horizontal paths); notably, in this exemplary embodiment, the u-turn circuit includes one or more buffers with their associated wire/conductor routing which, in whole or in part, may be employed in the clock signal distribution path to generate a tile clock signal (having the appropriate or programmable skew relative to the tile clock signals of other logic tiles—see, for example, FIG. 12) that, in one embodiment, such circuitry is employed to generate the Tile Clock (i.e., a local clock for that logic tile); as noted above, the tile clock may be employed by, for example, the logic circuitry (and/or memory) to implement functions or operations of the associated logic tile and/or synchronize communication with other logic tiles and/or the external inputs and outputs of the programmable/configurable logic circuitry.

The present inventions may be employed in connection with any "shape" tile including, for example, square, rectangle, trapezoid, pentagon and/or hexagon. Where the propagation delay of clock input and output paths in one direction are different from another direction (for example, the delay introduced in the vertical direction are different from the delay introduced in the horizontal direction), the control circuitry may program the clock distribution path to provide a relationship of the horizontal and vertical propagation delay components between the tiles. For example, with reference to FIG. 11, an exemplary clock distribution and transmission circuitry of a rectangular-shaped logic tile includes input and output clock signal path lengths in a vertical direction that are different than a horizontal direction and, as such, the input and output paths of the logic tile may include one input/output and u-turn circuit to introduce additional vertical and horizontal propagation delay components of the clock signal path (wherein the length of the vertical paths are different from horizontal paths). Under these circumstances, the relationship of the vertical clock signal line propagation delay and horizontal clock signal line propagation delay may be determined, calculated and/or compensated separately by the control circuitry (and/or clock distribution and transmission circuitry) when determining a predetermined or desired skew (for example, no or zero skew) between logic tiles.

Figure 12:
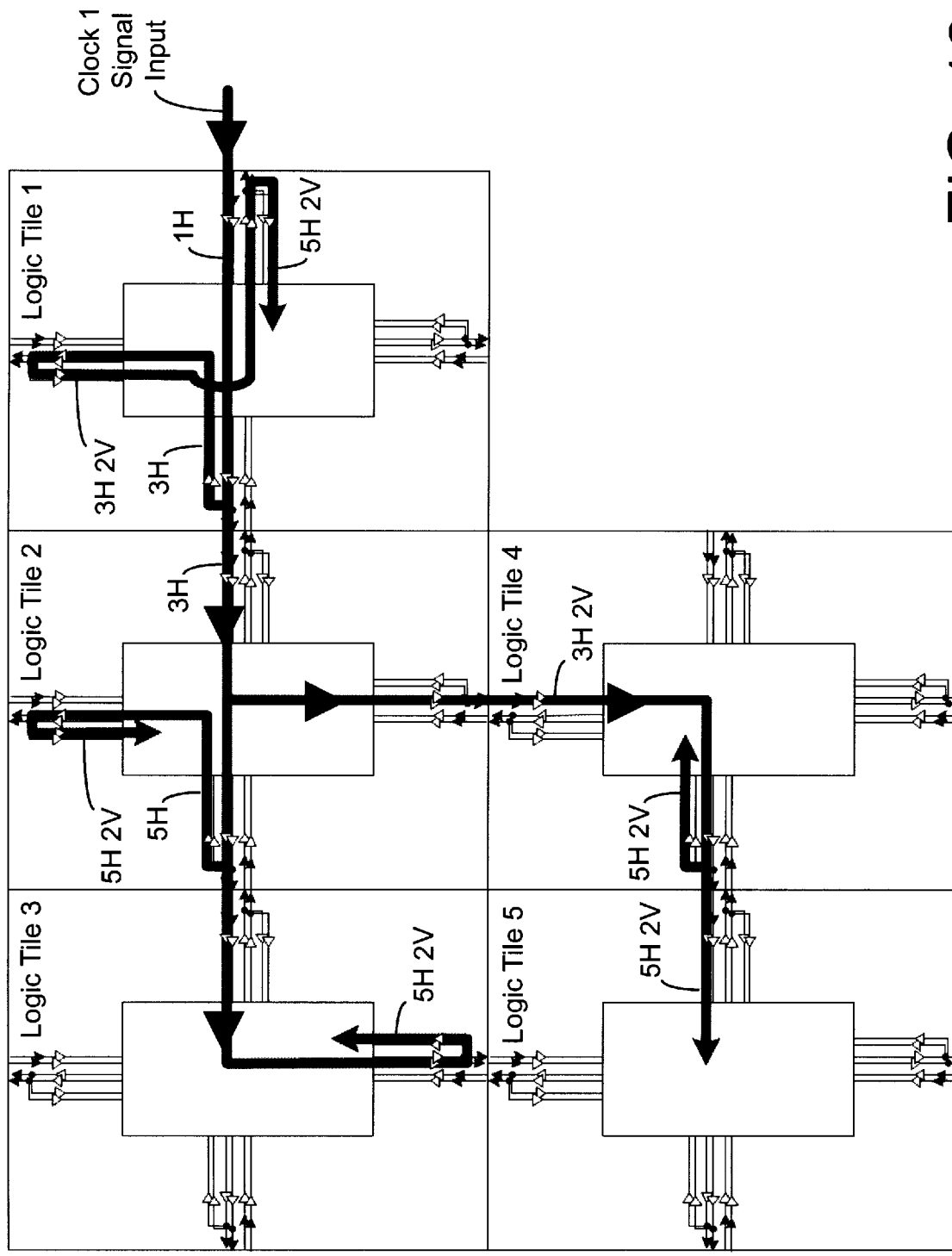
FIG. 12 illustrates an exemplary block diagram representation of a plurality of interconnected logic tiles of, for example, the type of logic tiles illustrated in FIG. 11, wherein the tile clock signals are generated in each of the logic tiles via the exemplary clock distribution and transmission circuitry of the associated logic tile; the exemplary clock distribution and distribution path, and direction thereof, is indicated by the bold line and the arrows wherein the clock distribution and transmission circuitry of each logic tile is configured or programmed to provide a clock distribution and distribution path (each having the same vertical and horizontal propagation delay components—i.e., in this exemplary embodiment 5 Horizontal and 2 Vertical) that provides the programmed relationship of the tile clock signals (here, substantially no or zero skew) that are employed by each of the logic tiles; in this exemplary embodiment, Clock 1 signal input is received by Logic Tile 1 which, in addition to distributing and transmitting the clock signal to Logic Tile 2, incorporates a delay (which includes vertical and horizontal components of the propagation delay) that provides a predetermined relationship of the clock signal employed by Logic Tile 1 to the clock signals of Logic Tiles 2-5 (and, in certain embodiments, one, some or all of the other Logic Tiles of the programmable/configurable logic circuitry); notably, although not illustrated in FIG. 12, more than one clock signal input may be received by one or more clock tiles as described and illustrated herein; the one or more of the clock signal inputs may originate directly or indirectly from clock circuitry disposed "on-chip", for example, clock circuitry integrated in/on the die of the integrated circuit (see, for example, FIG. 1A) or clock circuitry which is partially or entirely external to the die of the integrated circuit (for example, Clock Signal Input may originate on another logic tiles and/or clock alignment circuitry (for example, a DLL or PLL) which is partially or fully on-chip or off-chip.

With reference to FIG. 12, the exemplary clock distribution and distribution path, and direction thereof, is indicated by the bold line and the arrows wherein the clock distribution and transmission circuitry of each logic tile is configured or programmed to provide a clock distribution and distribution path (each having the same vertical and horizontal propagation delay components—i.e., in this exemplary embodiment 5 Horizontal and 2 Vertical) that provides an exemplary programmed relationship of the tile clock signals (here, substantially no or zero skew) that are employed by each of the logic tiles. In this exemplary embodiment, the clock signal input is received by Logic Tile 1 which, in addition to distributing and transmitting the clock signal to Logic Tile 2, incorporates a delay (which includes vertical and horizontal components of the propagation delay) that provides a predetermined relationship of the clock signal employed by Logic Tile 1 to the clock signals of Logic Tiles 2-5 (and, in certain embodiments, one, some or all of the other Logic Tiles of the programmable/configurable logic circuitry). In this exemplary embodiment, each of the Logic Tiles have incorporated the same clock delay (5 Horizontal and 2 Vertical) using, in certain instances, u-turn circuitry, to balance the clock skew between the Logic Tiles.

Thus, although many of the embodiments are described in the context of a square shape tile (where the vertical and horizontal components of the propagation delay are equal or substantially equal), the present inventions may be implemented where the lengths of the vertical and horizontal clock signal lines are not equal. Under these circumstances, the relationship of the clock signal line delay to vertical and horizontal delay may be separately determined and/or calculated by control circuitry and thereafter appropriately configured to provide a predetermined clock skew (which in FIG. 12 is zero). All of the inventions described and illustrated herein are entirely applicable to non-square logic tile shapes or to logic tiles where the vertical component of the propagation delay is different from the horizontal component of the propagation delay. For the sake of brevity, the discussions of the inventions set forth herein in connection with non-square shaped tiles (or logic tiles having an amount of propagation delay in a first direction on the logic tile that differs from an amount of propagation delay in a second direction on the logic tile) will not be repeated. As such, a separate discussion for each and every logic tile shape is not provided; however the applicability will be clear to one of ordinary skill in the art based on the instant disclosure to, for example, square, rectangle, trapezoid, pentagon and/or hexagon and/or logic tiles having components of the propagation delay within the that differ, for example, based on the direction of the clock path).

Notably, the present inventions are applicable to clocking circuitry and architectures beyond the x-y dimension or plane. For example, in the context of a 3-D integrated circuit chips where tiles may exist on different silicon layers or where the clock architecture traverses vertically within an integrated circuit, the clock paths would be matched in the z dimension or plane. To be sure, the applicability of the inventions described and/or illustrated herein to beyond the x-y dimension or plane will be clear to one of ordinary skill in the art in view of this application.

Figure 13A:
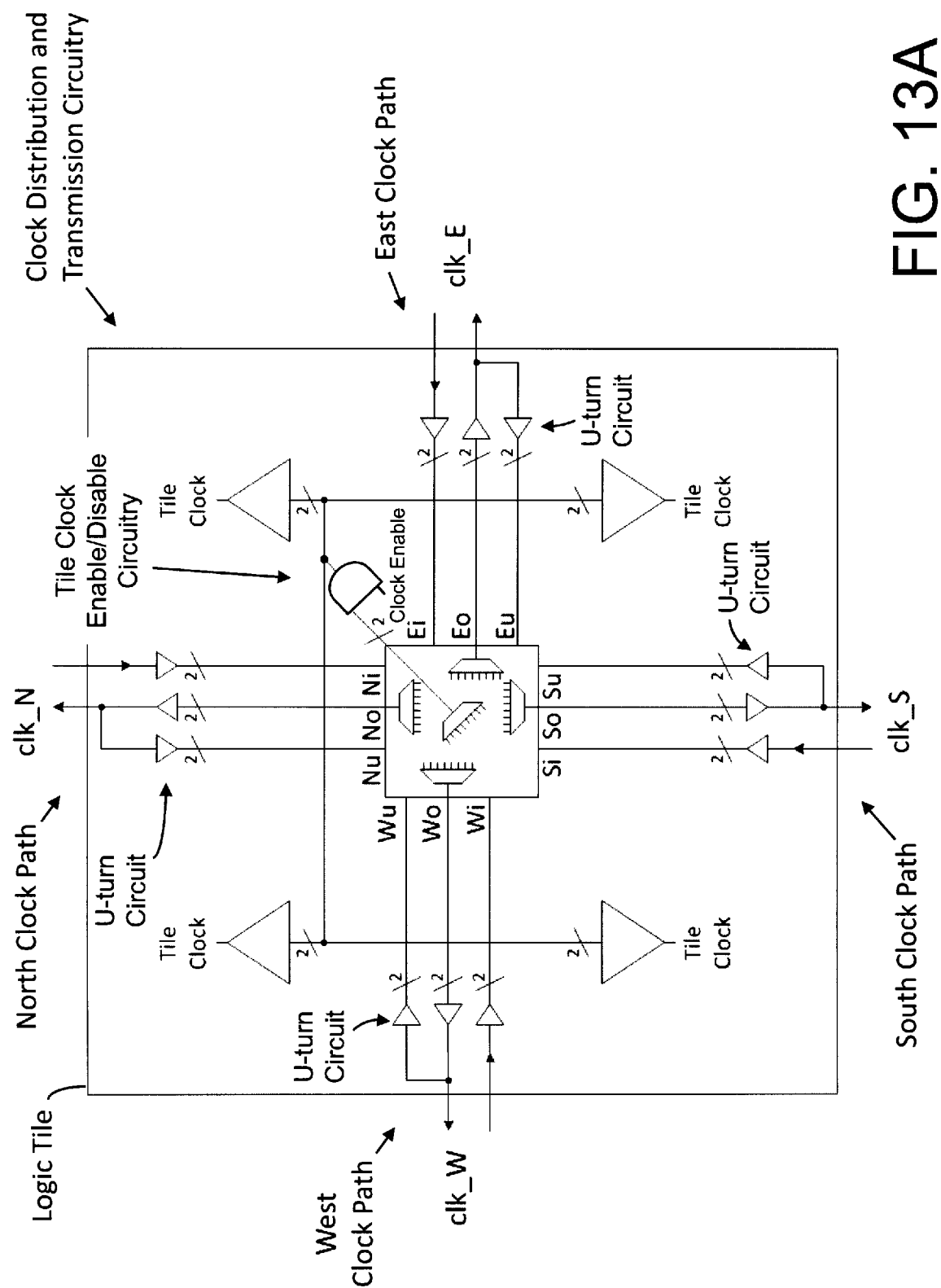
FIG. 13A illustrates, in schematic block diagram form, an exemplary embodiment of clock distribution and transmission circuitry of a logic tile wherein the clock distribution and transmission circuitry includes a plurality of input and output paths (four paths in this illustrated embodiment—labeled "north clock path", "east clock path", "south clock path" and "west clock path") to generate tile clock signals having a desired or programmable skew (as discussed above in relation to the embodiments of FIGS. 2A-2C); in addition, the clock distribution and transmission circuitry further includes tile clock enable/disable circuitry to responsively enable or disable generation and/or output of a local tile clock (i.e., Tile Clock) for the logic tile (which, as discussed herein, may be employed by, for example, logic circuitry (and/or memory) to implement functions or operations of the associated logic tile and/or synchronize communication with other logic tiles and/or the external inputs and outputs of the programmable/configurable logic circuitry); control circuitry (for example, in the logic tile and/or outside of the logic tile array (e.g., see FIG. 1A)) may generate one or more control signals to control such tile clock enable/disable circuitry; notably, although in this illustrative embodiment, the tile clock enable/disable circuitry is an AND logic gate, any logic or circuitry may be employed to responsively enable or disable generation and/or output of a local tile clock; moreover, the clock enable/disable circuitry may be implemented in any of the embodiments described and illustrated herein.

With reference to FIG. 13A, the clock distribution and transmission circuitry of the logic tiles may include tile clock enable/disable circuitry to responsively enable or disable generation of and/or output of a local tile clock (i.e., Tile Clock) for the logic tile (which, as discussed herein, may be employed by, for example, logic circuitry (and/or memory) to implement functions or operations of the associated logic tile and/or synchronize communication with other logic tiles and/or the external inputs and outputs of the programmable/configurable logic circuitry). The tile clock enable/disable circuitry is controlled by control circuitry—for example, in the logic tile and/or outside of the logic tile array (such as, for example, the "Control Circuitry" in FIG. 1A). In one embodiment, one or more control signals are applied to the tile clock enable/disable circuitry in order to disable the generation of and/or output of a local tile clock; here the default of the circuitry is to enable the generation of and/or output of a local tile clock. Notably, although in this illustrative embodiment, the tile clock enable/disable circuitry is an AND logic gate, any logic or circuitry may be employed—all of which are intended to fall within the scope of the present inventions.

For the avoidance of doubt, the clock distribution and transmission circuitry of the logic tiles of any and all of the embodiments described and/or illustrated herein may include tile clock enable/disable circuitry. For the sake of brevity, a separate discussion/illustration of each embodiment implementing such clock distribution and transmission circuitry is not provided; however the implementation is clear to one of ordinary skill in the art based on the instant disclosure.

Figure 13B:
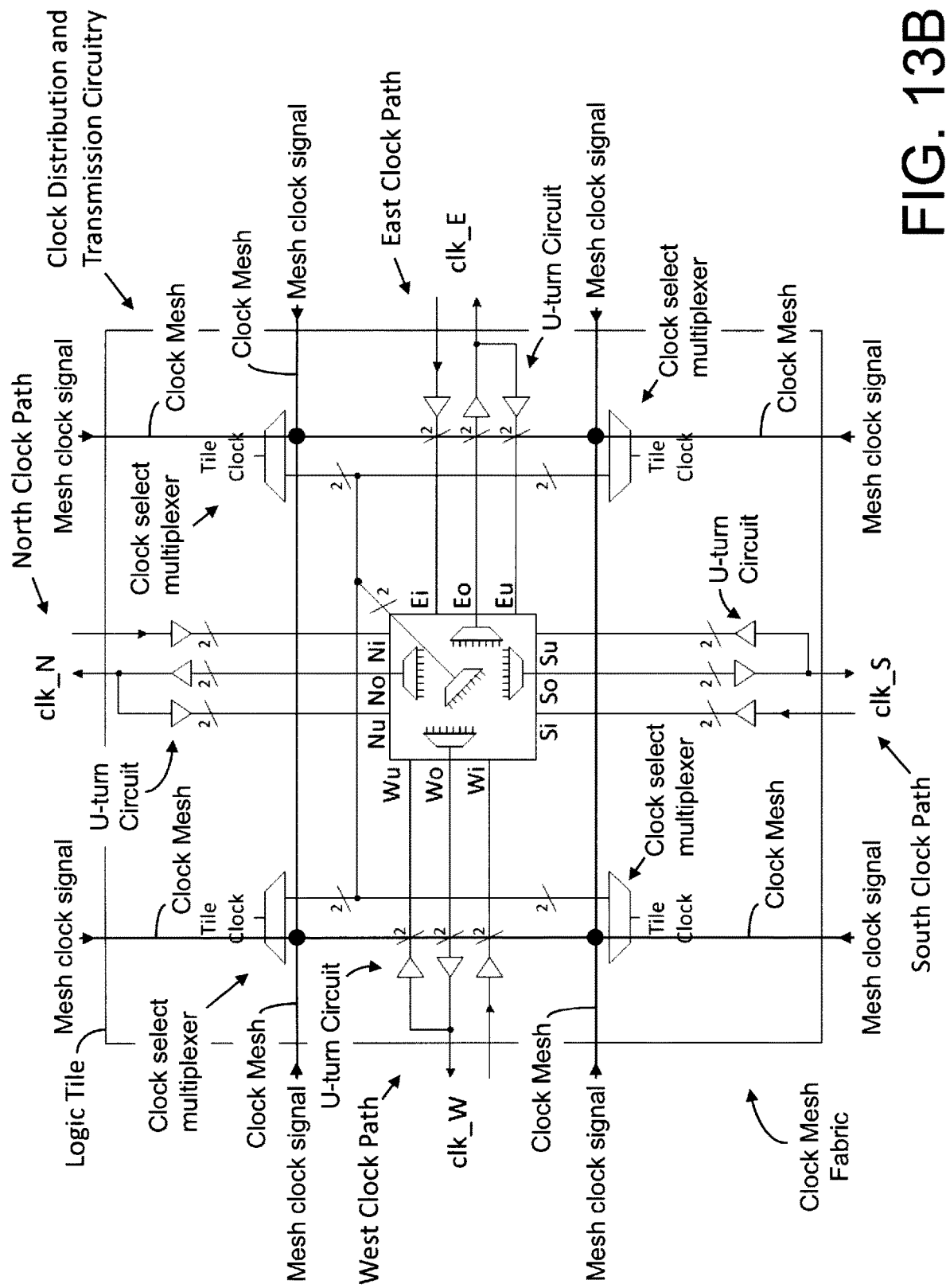
FIG. 13B illustrates, in a schematic block diagram form, another exemplary embodiment of clock distribution and transmission circuitry of a logic tile of the array of logic tiles according to at least one aspect of the present inventions, wherein the clock distribution and transmission circuitry generates and/or selects one or more tile clock signals having a desired or programmable skew and, in this embodiment, includes a plurality of input and output paths (four paths in this illustrated embodiment—labeled "north clock path", "east clock path", "south clock path" and "west clock path") to generate one or more tile clock signals having a desired or programmable skew), receives a clock mesh (for transmitting a mesh clock signal to the logic tiles of the array), and includes clock selection circuitry to select a clock signal to employ in the logic tile; in one exemplary embodiment, the clock selection circuitry includes clock select multiplexer(s) which receives the tile clock signals and the mesh clock signal (and any other clock signals); the desired clock signal may be available to the circuitry of the logic tile (to, for example, implement operations therein (e.g., memory, functions, etc.) via selectively enabling one of the clock inputs to the clock select multiplexer(s) to connect selected input to the output of the clock select multiplexer(s); such clock select multiplexers, in one embodiment, responsively output either the mesh clock signal or an internally generated/derived clock signal as a tile clock which is used by the circuitry of the logic tile to perform or execute, for example, functions and/or operations; control circuitry (for example, in the logic tile and/or outside of the logic tile array) may enable use of the mesh clock (in lieu of other clock signals), via control of such clock select multiplexer(s); notably, the clock mesh (and circuitry and/or control related thereto) of FIG. 13B may be implemented in conjunction with the tile clock enable/disable circuitry of FIG. 13A; indeed, in those instances where/when the logic tile employs the mesh clock, the tile clock enable/disable circuitry may disable generation and output of the local tile clock (which is generated from or using the transmitted/distributed and delay matched clock signals input to logic tiles on one or more peripheries or perimeters of the logic tile array (see, for example, FIGS. 3A-3G))

With reference to FIG. 13B, in another embodiment, the clock distribution and transmission circuitry of a logic tile of the array of logic tiles further includes circuitry to receive and employ a mesh clock signal in the logic tile in connection with one or more functions/operations implemented by one or more logic tiles. Here, a clock mesh provides the mesh clock signal to the logic tile. Note this clock mesh is different from the "clock-mesh" structure in FIG. 7B realized using multiplexer inputs. In common silicon design, the on-chip clock mesh is shorted together using metallization/routing, instead of shorting multiple inputs of a multiplexer together as in FIG. 7B and/or FIG. 7C. For example, in one embodiment, the array of a plurality of logic tiles receives one or more separate clock signal(s) (as described above) as well as a mesh clock (via a clock mesh architecture) which may be distributed to each of the logic tiles and employed by the logic tiles to perform various functions/operations. Control circuitry may enable use of the mesh clock (in lieu of other clock signals) within one or more logic tiles of the array and in connection with one or more functions/operations implemented by one or more logic tiles.

With reference to FIGS. 13B-13D, in one embodiment, the clock distribution and transmission circuitry includes clock selection circuitry (e.g., one or more clock select multiplexers) to selectively and responsively output one of signals for use as a local clock signal (i.e., Tile Clock) in the associated logic tile in performance or connection with one or more functions/operations implemented by one or more logic tiles. With continued reference to FIG. 13B, in one embodiment, the clock selection circuitry includes one or more clock select multiplexers. Here, the control circuitry selectively enables use of a clock mesh signal via control of a clock select multiplexer which receives multiple clock signals (including the clock mesh clock). In this embodiment, clock distribution and transmission circuitry of a logic tile of the physical array of logic tiles also includes a plurality of input and output paths (four paths in this illustrated embodiment—labeled "north clock path", "east clock path", "south clock path" and "west clock path") to receive and/or generate tile clock signals having a desired or programmable skew and, in addition receives a clock mesh signal (via a mesh clock layout). By selectively controlling the clock select multiplexer(s), the logic tile employs a given clock signal (for example, the mesh clock signal). That is, the clock select multiplexers, in one embodiment, responsively output either the mesh clock signal or an internally generated/derived clock signal (for example, a delay matched clock signal that is generated using any of the circuitry and/or techniques described above) as a tile clock which is used by the circuitry of the logic tile to perform or execute, for example, functions and/or operations. The control circuitry may enable use of the mesh clock (in lieu of other clock signals), via control of such clock select multiplexer(s), within one or more logic tiles and in connection with one or more functions/operations implemented by one or more logic tiles.

Thus, in one embodiment, the clock select multiplexers responsively output either the mesh clock signal or an internally generated/derived clock signal (for example, the delay matched clock signal) as a tile clock which is used by the circuitry of the logic tile to perform or execute, for example, functions and/or operations. Notably, in one embodiment, the clock select multiplexers are separately/individually controlled relative to other clock select multiplexers in the logic tile or logic tiles (e.g., via separate select/control signals applied to one or more of the clock select multiplexers); in another embodiment, the clock select multiplexers of a logic tile or logic tiles are controlled as a group (e.g., via one select/control signal).

In one embodiment, control circuitry determines the use of a particular clock signal within a given logic tile on a tile-by-tile basis or group of tiles-by-group of tiles basis. That is, one or more logic tiles may employ the internally generated tile clock (based on, for example, a delay matched clock signal) and one or more other logic tiles may employ the mesh clock signal that is provided to the logic tiles via the clock mesh of the clock mesh fabric. The control circuitry may separately and/or individually (on a logic tile by logic tile basis) enable use of the mesh clock signal (in lieu of other clock signals), via control of such clock select multiplexer(s), within one or more logic tiles—for example, in connection with one or more functions/operations implemented by such one or more logic tiles. For example, control circuitry may apply control signals to (i) the clock selection circuitry (e.g., clock select multiplexers) associated with or of a first group of one or more logic tiles to responsively output and employ the mesh clock in a first group of one or more logic tiles and (i) the clock selection circuitry (e.g., clock select multiplexers) associated with or of a second group of one or more logic tiles to responsively output and employ the internally generated tile clock (based on, for example, a delay matched clock signal) in a second group of one or more logic tiles. Indeed, in one embodiment, the control circuitry may separately or individually control the clock selection circuitry (e.g., clock select multiplexers via applying different input select signals to the multiplexers within the given logic tile) in the logic tile in order to facilitate implementation or use of more than one clock signal within the logic tile.

In yet another embodiment, the control circuitry (which may include or be memory which, for example, stores data which is representative of the control signals) may apply control signals to the clock select multiplexers associated with all of the logic tiles to responsively output and employ (i) the mesh clock signal in a first group of one or more logic tiles or (ii) the internally generated tile clock (based on, for example, a delay matched clock signal). Notably, such control signals may be stored in memory and applied to one or more of the clock selection circuitry (e.g., clock select multiplexers) during configuration or re-configuration of the associated logic tiles (for example, at start-up/initialization). In one embodiment, control of the clock select multiplexers is fixed for a given configuration of the logic tiles of the array of logic tiles (i.e., until such logic tiles are re-configured). In another embodiment, the control signals may be modified in situ (i.e., during operation of the FPGA or integrated circuit). For example, the clock signal employed by one or more logic tiles (or circuitry within one or more logic tiles) may change during operation, for example, based on performance or execution of functions, operations and/or communication of such one or more logic tiles.

Notably, where the data states of the control signals are stored in memory, such data of the control signals may be fixed (start-up/initialization) or dynamic (modifiable after start-up/initialization). Here, the control circuitry includes memory that stores the data state(s) of the control signals. With reference to FIG. 13C, in one embodiment, the data state(s) stored in memory may then be read and applied as control signals to the clock selection circuitry (which, in one embodiment, is embodiment is or includes one or more clock select multiplexers—see, e.g., FIG. 13B) to implement use of one or more particular tile clock (local clock signal) within the associated logic tile.

Notably, the clock mesh architecture and circuitry may be implemented in any of the embodiments described and/or illustrated herein. For the sake of brevity, a separate discussion/illustration of each embodiment implementing a clock mesh architecture is not provided; however the implementation is clear to one of ordinary skill in the art based on the instant disclosure. Moreover, the clock mesh and circuitry related thereto of FIG. 13B may be implemented in conjunction with the tile clock enable/disable circuitry of FIG. 13A such that, in one embodiment, when the logic tile employs the mesh clock, the tile clock enable/disable circuitry may disable generation and output of the local tile clock (which is generated from or using the transmitted/distributed and delay matched clock signals input to logic tiles on one or more peripheries of the array (see, for example, FIGS. 3A-3G).

The term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

The memory which stores the data, equations, relationships, and/or look up table may be a permanent, semi-permanent or temporary (i.e., until re-programmed) storage that is discrete or resident on (i.e., integrated in), for example, the control circuitry. In connection with this invention, the memory may store the programmable skew relationship (whether zero or non-zero) between the Tile Clock Signals and Tile Clocks of the Logic Tiles of the Programmable/Configurable Logic Circuitry. As such, in one embodiment, the memory may be one time programmable, or data, equations, relationships, and/or look up table employed by the control circuitry may be one time programmable (for example, programmed during test or at manufacture). In another embodiment, the memory is more than one time programmable and, as such, the predetermined values and/or band limits employed by the control circuitry may be modified after test and/or manufacture.

Notably, the u-turn circuits have been described as consisting of buffers. However, the u-turn circuits may be comprised of any active or passive element now known or later developed which may be employed to generate a desired or programmable skew and/or phase relative to the tile clock signals of other logic tiles of the programmable/configurable logic circuitry of an integrated circuit. For example, in one embodiment, one or more conventional-type buffers may be employed.

As mentioned above, the techniques described herein may be implemented using one or more processors (suitably programmed) to perform, execute and/or assess one or more of the functions or operations described herein to generate clock signal distribution and transmission networks or architectures of the present inventions.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations using computer aided design and/or testing tools. The simulation of the charging circuitry, control circuitry and/or monitoring circuitry, and/or techniques implemented thereby, may be implemented by a computer system wherein characteristics and operations of such circuitry, and techniques implemented thereby, are imitated, replicated and/or predicted via a computer system. The present inventions are also directed to such simulations of the inventive charging circuitry, control circuitry and/or monitoring circuitry, and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as "exemplary" is not to be construed as preferred or advantageous, for example, over other embodiments or implementations; rather, it is intended convey or indicate the embodiment or embodiments are example embodiment(s).

Finally, although the present inventions have been described in certain specific aspects, many additional modifications and variations would be apparent to those skilled in the art. It is therefore to be understood that the present inventions may be practiced otherwise than specifically described without departing from the scope and spirit of the present invention. Thus, embodiments of the present inventions should be considered in all respects as illustrative and not restrictive.

The terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item.

Further, the term "logic tile" means a design unit or block of a plurality of transistors (typically more than thousands) that are connected or configured, for example, into programmable components (e.g., programmable logic components), which, in this application, is capable of connecting to one or more neighboring "logic tiles" (for example, in or during operation). The term (i) "integrated circuit" means, among other things, a processor, controller, state machine, gate array, SOC, PGA and/or FPGA.

In addition, the term "data" may mean, among other things, a current or voltage signal(s) whether in analog or a digital form (which may be a single bit (or the like) or multiple bits (or the like)). The term "zero skew" means zero or substantially zero skew (i.e., within 10% of zero skew).

The terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus. Use of the terms "connect", "connected", "connecting" or "connection" throughout this document should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

What is claimed is:

1. An integrated circuit comprising
 a first plurality of logic tiles and a second plurality of logic tiles, wherein the logic tiles of the first plurality of logic tiles are different from the logic tiles of the second plurality of logic tiles and wherein each logic tile of the first plurality of logic tiles and the second plurality of logic tiles includes:
   at least one input clock path, wherein the input clock path includes circuitry which is configurable to receive a clock signal,
   a plurality of output clock paths, wherein each output clock path includes circuitry which is configurable to transmit a tile output clock signal to one or more neighboring logic tiles, and
   tile clock generation circuitry, coupled to the input clock path, configurable to generate a tile clock, having a skew, wherein the skew between the tile clocks of each logic tile of the plurality of logic tiles is zero; and
 wherein:
   the first plurality of logic tiles includes a first logic tile to receive a first external clock signal at an input of a first input clock path thereof, wherein each logic tile of a first plurality of logic tiles is configurable to generate its tile clock using (i) the first external clock signal received by the first logic tile or (ii) a delayed version of the first external clock signal received from one of the plurality of output clock paths of a logic tile of the first plurality of logic tiles, wherein at least one of the logic tiles of the first plurality of
logic tiles, in operation, generates its tile clock using
a delayed version of the first external clock signal
received from one of the plurality of output clock
paths of a different logic tile of the first plurality of
logic tiles, and the second plurality of logic tiles includes a second
logic tile to receive a second external clock signal at
an input of a first input clock path thereof, wherein
each logic tile of a second plurality of logic tiles is
configurable to generate its tile clock using (i) the
second external clock signal received by the second
logic tile or (ii) a delayed version of the second
external clock signal received from one of the plurality of output clock paths of a logic tile of the
second plurality of logic tiles, wherein at least one of
the logic tiles of the second plurality of logic tiles, in
operation, generates its tile clock using a delayed
version of the second external clock signal received
from one of the plurality of output clock paths of a
different logic tile of the second plurality of logic
tiles; and timing circuitry, external to the first plurality of logic tiles
and a second plurality of logic tiles and electrically
connected to the first input clock paths of at least the
first logic tile and the second logic tile, to generate the
first external clock signal and the second external clock
signal, wherein the first external clock and second
external clock signal have the same clock frequency
and zero skew with respect to each other.

2. The integrated circuit of claim 1 wherein:
the first plurality of logic tiles and second plurality are
arranged in an array rows and columns of logic tiles,
and wherein the input of the first input clock path of the
first logic tile is located on an external perimeter of a
first side of the array of logic tiles and the input of the
first input clock path of the second logic tile is located
on an external perimeter of a second side of the array
of logic tiles.

3. The integrated circuit of claim 2 wherein:
each output clock path of the plurality of output clock
paths of each logic tile of the array of logic tiles
includes at least one u-turn circuit.

4. The integrated circuit of claim 2 wherein:
the external perimeter of the first side of the array of logic
tiles is opposite the external perimeter of the second
side of the array of logic tiles.

5. The integrated circuit of claim 1 wherein:
the tile clock generation circuitry of each logic tile
includes one or more buffers.

6. The integrated circuit of claim 1 wherein:
the input of the first input clock path of the first logic tile
is located on a first side of an array of logic tiles and the
input of the first input clock path of the second logic tile
is located on a second side of the array of logic tiles.

7. The integrated circuit of claim 1 wherein:
wherein each logic tile of the first plurality of logic tiles
is configurable to generate its tile clock using a delayed
version of the second external clock signal received
from at least one of the second plurality of logic tiles,
and wherein each logic tile of the second plurality of logic
tiles is configurable to generate its tile clock using a
delayed version of the first external clock signal
received from at least one of the first plurality of logic
tiles.

8. The integrated circuit of claim 1 wherein:
the tile clock generation circuitry of each logic tile of the
first plurality of logic tiles and second plurality of logic
tiles includes a multiplexer to: (a) receive (i) the first
external clock signal or a delayed version of the first
external clock signal received from at least one of the
first plurality of logic tiles and (ii) the second external
clock signal or a delayed version of the second external
clock signal received from at least one of the second
plurality of logic tiles, and (b) responsively output one
of: (i) the received first external clock signal or the
received delayed version of the first external clock
signal or (ii) the received second external clock signal
or the received delayed version of the second external
clock signal, and wherein the tile clock generation circuitry generates the
tile clock using the output of the multiplexer.

9. An integrated circuit comprising:
an array of logic tiles, wherein each logic tile of the array
of logic tiles includes:
at least one input clock path, wherein the input clock
path includes circuitry which is configurable to
receive a clock signal,
a plurality of output clock paths, wherein each output
clock path includes circuitry which is configurable to
transmit a tile output clock signal to one or more
logic tiles of the array of logic tiles which is/are
adjacent thereto,
tile clock generation circuitry, coupled to the input
clock path, configurable to generate a tile clock,
having a skew, and
circuitry, coupled to the tile clock generation circuitry,
to perform operations using or based on the tile
clock; and
wherein the array of logic tiles includes a plurality of
columns of logic tiles and a plurality of rows of logic
tiles, including:
a first column of logic tiles, wherein each logic tile of
the first column of logic tiles receives a first external
clock signal at an input of the associated at least one
input clock path and wherein each logic tile of a first
plurality of logic tiles of the array of logic tiles is
configurable to generate its tile clock using (i) the
first external clock signal received by a logic tile of
the first column of logic tiles or (ii) a delayed version
of the first external clock signal received from one of
the plurality of output clock paths of at least one
logic tile of the first column of logic tiles, wherein
the logic tiles of the first column of logic tiles are a
portion of the first plurality of logic tiles, and
a second column of logic tiles, wherein each logic tile
of the second of logic tiles receives a second external
clock signal at an input of the associated at least one
input clock path and wherein each logic tile of a
second plurality of logic tiles of the array of logic
tiles is configurable to generate its tile clock using (i)
the second external clock signal received by a logic
tile of the second column of logic tiles or (ii) a
delayed version of the second external clock signal
received from one of the plurality of output clock
paths of at least one logic tile of the second column
of logic tiles, wherein the logic tiles of the second
column of logic tiles are a portion of the second
plurality of logic tiles, and wherein:
the logic tiles of the first plurality of logic tiles are
different from the logic tiles of the second plurality of logic tiles, at least one of the logic tiles of the first plurality of
logic tiles generates its tile clock using a delayed
version of the first external clock signal received
from one of the plurality of output clock paths of
a logic tile in the first column of logic tiles,
at least one of the logic tiles of the second plurality
of logic tiles generates its tile clock using a
delayed version of the second external clock signal received from one of the plurality of output
clock paths of a logic tile in the second column of
logic tiles, and
the first and second external clock signals have the same
clock frequency and zero skew with respect to each
other.

10. The integrated circuit of claim 9 wherein the first column of logic tiles is located on a first exterior perimeter of the array of logic tiles, the second column of logic tiles is located on a second exterior perimeter of the array of logic tiles, and at least one additional column of logic tiles are disposed between the first column and second column of logic tiles.

11. The integrated circuit of claim 9 wherein:
wherein each logic tile of the first plurality of logic tiles of the array of logic tiles is further configurable to generate its tile clock using (i) the second external clock signal received by a logic tile of the second column of logic tile or (ii) a delayed version of the second external clock signal received from one of the plurality of output clock paths of at least one logic tile in the second plurality of logic tiles, and
wherein each logic tile of the second plurality of logic tiles of the array of logic tiles is further configurable to generate its tile clock using (i) the first external clock signal received by a logic tile of the first column of logic tile or (ii) a delayed version of the first external clock signal received from one of the plurality of output clock paths of at least one logic tile in the first plurality of logic tiles.

12. The integrated circuit of claim 11 wherein:
the tile clock generation circuitry of each logic tile of the first plurality of logic tiles and second plurality of logic tiles of the array of logic tiles includes a multiplexer to:
(a) receive (i) the first external clock signal or a delayed version of the first external clock signal and (ii) the second external clock signal or a delayed version of the second external clock signal, and (b) responsively output one of: (i) the received first external clock signal or the received delayed version of the first external clock signal or (ii) the received second external clock signal received by the first logic tile or the received delayed version of the second external clock signal, and
wherein the tile clock generation circuitry generates the tile clock using the output of the multiplexer.

13. The integrated circuit of claim 9 wherein each output clock path of the plurality of output clock paths of each logic tile of the array of logic tiles includes at least one u-turn circuit.

14. The integrated circuit of claim 9 wherein a shape of at least one logic tile of the array of logic tiles is rectangular.

15. An integrated circuit comprising:
an array of logic tiles, wherein each logic tile of the array of logic tiles includes:
at least one input clock path, wherein the input clock path includes circuitry which is configurable to receive a clock signal,
a plurality of output clock paths, wherein each output clock path includes circuitry which is configurable to transmit a tile output clock signal to one or more logic tiles of the array of logic tiles which is/are adjacent thereto,
tile clock generation circuitry, coupled to the input clock path, configurable to generate a tile clock, having a skew, and
circuitry, coupled to the tile clock generation circuitry, to perform operations using or based on the tile clock; and
wherein the array of logic tiles includes a plurality of columns of logic tiles and a plurality of rows of logic tiles, including:
a first row of logic tiles, wherein each logic tile of the first row of logic tiles receives a first external clock signal at an input of the associated at least one input clock path and wherein each logic tile of a first plurality of logic tiles of the array of logic tiles is configurable to generate its tile clock using (i) the first external clock signal received by a logic tile of the first row of logic tiles or (ii) a delayed version of the first external clock signal received from one of the plurality of output clock paths of at least one logic tile of the first row of logic tiles, wherein the logic tiles of the first row of logic tiles are a portion of the first plurality of logic tiles, and
a second row of logic tiles, wherein each logic tile of the second of logic tiles receives a second external clock signal at an input of the associated at least one input clock path and wherein each logic tile of a second plurality of logic tiles of the array of logic tiles is configurable to generate its tile clock using (i) the second external clock signal received by a logic tile of the second row of logic tiles or (ii) a delayed version of the second external clock signal received from one of the plurality of output clock paths of at least one logic tile of the second row of logic tiles, wherein the logic tiles of the second row of logic tiles are a portion of the second plurality of logic tiles, and
wherein:
the logic tiles of the first plurality of logic tiles are different from the logic tiles of the second plurality of logic tiles,
at least one of the logic tiles of the first plurality of logic tiles generates its tile clock using a delayed version of the first external clock signal received from one of the plurality of output clock paths of a logic tile in the first row of logic tiles,
at least one of the logic tiles of the second plurality of logic tiles generates its tile clock using a delayed version of the second external clock signal received from one of the plurality of output clock paths of a logic tile in the second row of logic tiles, and
the first and second external clock signals have the same clock frequency and zero skew with respect to each other.

16. The integrated circuit of claim 15 wherein the first row of logic tiles is located on a first exterior perimeter of the array of logic tiles, the second row of logic tiles is located on a second exterior perimeter of the array of logic tiles, and at least one additional row of logic tiles are disposed between the first row and second row of logic tiles.

17. The integrated circuit of claim 15 wherein:
wherein each logic tile of the first plurality of logic tiles of the array of logic tiles is further configurable to generate its tile clock using (i) the second external clock signal received by a logic tile of the second row of logic tile or (ii) a delayed version of the second external clock signal received from one of the plurality of output clock paths of at least one logic tile in the second plurality of logic tiles, and wherein each logic tile of the second plurality of logic tiles of the array of logic tiles is further configurable to generate its tile clock using (i) the first external clock signal received by a logic tile of the first row of logic tile or (ii) a delayed version of the first external clock signal received from one of the plurality of output clock paths of at least one logic tile in the first plurality of logic tiles.

18. The integrated circuit of claim 17 wherein:
the tile clock generation circuitry of each logic tile of the first plurality of logic tiles and second plurality of logic tiles of the array of logic tiles includes a multiplexer to: (a) receive (i) the first external clock signal or a delayed version of the first external clock signal and (ii) the second external clock signal or a delayed version of the second external clock signal, and (b) responsively output one of: (i) the received first external clock signal or the received delayed version of the first external clock signal or (ii) the received second external clock signal received by the first logic tile or the received delayed version of the second external clock signal, and wherein the tile clock generation circuitry generates the tile clock using the output of the multiplexer.

19. The integrated circuit of claim 15 wherein each output clock path of the plurality of output clock paths of each logic tile of the array of logic tiles includes at least one u-turn circuit.

20. The integrated circuit of claim 15 wherein a shape of at least one logic tile of the array of logic tiles is rectangular.

21. The integrated circuit of claim 15 wherein:
wherein at least one logic tile of the first plurality of logic tiles of the array of logic tiles is further configurable to generate its tile clock using (i) the second external clock signal received by a logic tile of the second row of logic tile or (ii) a delayed version of the second external clock signal received from one of the plurality of output clock paths of at least one logic tile in the second plurality of logic tiles.

22. The integrated circuit of claim 21 wherein:
the tile clock generation circuitry of the at least one logic tile of the first plurality of logic tiles that is configurable to generate its tile clock using (i) the second external clock signal received by a logic tile of the second row of logic tile or (ii) a delayed version of the second external clock signal received from one of the plurality of output clock paths of at least one logic tile in the second plurality of logic tiles further includes:
a multiplexer to: (a) receive (i) the first external clock signal or a delayed version of the first external clock signal and (ii) the second external clock signal or a delayed version of the second external clock signal, and (b) responsively output one of: (i) the received first external clock signal or the received delayed version of the first external clock signal or (ii) the received second external clock signal received by the first logic tile or the received delayed version of the second external clock signal, and wherein the tile clock generation circuitry thereof generates the tile clock using the output of the multiplexer.

23. The integrated circuit of claim 9 wherein:
wherein at least one logic tile of the first plurality of logic tiles of the array of logic tiles is further configurable to generate its tile clock using (i) the second external clock signal received by a logic tile of the second column of logic tile or (ii) a delayed version of the second external clock signal received from one of the plurality of output clock paths of at least one logic tile in the second plurality of logic tiles.

24. The integrated circuit of claim 23 wherein:
the tile clock generation circuitry of the at least one logic tile of the first plurality of logic tiles that is configurable to generate its tile clock using (i) the second external clock signal received by a logic tile of the second row of logic tile or (ii) a delayed version of the second external clock signal received from one of the plurality of output clock paths of at least one logic tile in the second plurality of logic tiles further includes:
a multiplexer to: (a) receive (i) the first external clock signal or a delayed version of the first external clock signal and (ii) the second external clock signal or a delayed version of the second external clock signal, and (b) responsively output one of: (i) the received first external clock signal or the received delayed version of the first external clock signal or (ii) the received second external clock signal received by the first logic tile or the received delayed version of the second external clock signal, and wherein the tile clock generation circuitry thereof generates the tile clock using the output of the multiplexer.

25. The integrated circuit of claim 1 wherein:
wherein at least one logic tile of the first plurality of logic tiles is configurable to generate its tile clock using a delayed version of the second external clock signal received from at least one of the second plurality of logic tiles.

26. The integrated circuit of claim 1 wherein:
the tile clock generation circuitry of at least one logic tile of the first plurality of logic tiles includes a multiplexer to: (a) receive (i) the first external clock signal or a delayed version of the first external clock signal received from at least one of the first plurality of logic tiles and (ii) the second external clock signal or a delayed version of the second external clock signal received from at least one of the second plurality of logic tiles, and (b) responsively output one of: (i) the received first external clock signal or the received delayed version of the first external clock signal or (ii) the received second external clock signal or the received delayed version of the second external clock signal, and wherein the tile clock generation circuitry of the at least one logic tile of the first plurality of logic tiles generates the tile clock using the output of the multiplexer.

\* \* \* \* \*